United States Patent
Brink et al.

(10) Patent No.: US 9,190,316 B2
(45) Date of Patent: Nov. 17, 2015

(54) LOW ENERGY ETCH PROCESS FOR NITROGEN-CONTAINING DIELECTRIC LAYER

(75) Inventors: Markus Brink, White Plains, NY (US); Robert L. Bruce, White Plains, NY (US); Sebastian U. Engelmann, New York, NY (US); Nicholas C. M. Fuller, North Hills, NY (US); Hiroyuki Miyazoe, White Plains, NY (US); Masahiro Nakamura, Eastchester, NY (US)

(73) Assignees: GLOBALFOUNDRIES U.S. 2 LLC, Hopewell Junction, NY (US); ZEON CORPORATION, Tokyo (JP)

( * ) Notice: Subject to any disclaimer, the term of this patent is extended or adjusted under 35 U.S.C. 154(b) by 0 days.

(21) Appl. No.: 13/281,732

(22) Filed: Oct. 26, 2011

(65) Prior Publication Data

US 2013/0105996 A1    May 2, 2013

(51) Int. Cl.
| | |
|---|---|
| H01L 21/00 | (2006.01) |
| H01L 21/768 | (2006.01) |
| H01L 21/311 | (2006.01) |
| H01L 21/321 | (2006.01) |

(52) U.S. Cl.
CPC .... *H01L 21/76802* (2013.01); *H01L 21/31116* (2013.01); *H01L 21/31144* (2013.01); *H01L 21/3212* (2013.01); *H01L 21/76813* (2013.01); *H01L 21/76831* (2013.01); *H01L 21/76834* (2013.01); *H01L 21/76835* (2013.01)

(58) Field of Classification Search
CPC .................. H01L 21/31116; H01L 21/31138; H01L 21/30655
USPC ........................................ 438/792, 706, 719
See application file for complete search history.

(56) References Cited

U.S. PATENT DOCUMENTS

| | | | | |
|---|---|---|---|---|
| 4,529,476 A | * | 7/1985 | Kawamoto et al. | 438/724 |
| 4,784,719 A | | 11/1988 | Schutz | |
| 5,176,790 A | * | 1/1993 | Arleo et al. | 438/715 |
| 5,318,667 A | | 6/1994 | Kumihashi et al. | |
| 5,814,563 A | | 9/1998 | Ding et al. | |
| 6,071,597 A | | 6/2000 | Yang et al. | |
| 6,074,959 A | * | 6/2000 | Wang et al. | 438/738 |

(Continued)

OTHER PUBLICATIONS

International Search Report dated Jan. 9, 2013, issued in International Application No. PCT/US2012/061771.

*Primary Examiner* — Eva Y Montalvo
*Assistant Examiner* — David Goodwin
(74) *Attorney, Agent, or Firm* — Scully, Scott, Murphy & Presser P.C.

(57) ABSTRACT

A stack that includes, from bottom to top, a nitrogen-containing dielectric layer, an interconnect level dielectric material layer, and a hard mask layer is formed on a substrate. The hard mask layer and the interconnect level dielectric material layer are patterned by an etch. Employing the patterned hard mask layer as an etch mask, the nitrogen-containing dielectric layer is patterned by a break-through anisotropic etch, which employs a fluorohydrocarbon-containing plasma to break through the nitrogen-containing dielectric layer. Fluorohydrocarbon gases used to generate the fluorohydrocarbon-containing plasma generate a carbon-rich polymer residue, which interact with the nitrogen-containing dielectric layer to form volatile compounds. Plasma energy can be decreased below 100 eV to reduce damage to physically exposed surfaces of the interconnect level dielectric material layer.

15 Claims, 15 Drawing Sheets

(56) References Cited

U.S. PATENT DOCUMENTS

| | | | |
|---|---|---|---|
| 6,444,137 B1 * | 9/2002 | Collins et al. | 216/79 |
| 6,475,920 B2 * | 11/2002 | Coburn et al. | 438/714 |
| 6,833,325 B2 | 12/2004 | Huang et al. | |
| 6,849,193 B2 * | 2/2005 | Hung et al. | 216/67 |
| 6,951,823 B2 * | 10/2005 | Waldfried et al. | 438/710 |
| 7,067,435 B2 * | 6/2006 | Dostalik | 438/740 |
| 7,074,723 B2 * | 7/2006 | Chinn et al. | 438/714 |
| 7,141,504 B1 * | 11/2006 | Bhardwaj | 438/700 |
| 7,229,925 B2 | 6/2007 | Kim | |
| 7,244,313 B1 * | 7/2007 | Zhou et al. | 134/1 |
| 7,335,588 B2 * | 2/2008 | Yang et al. | 438/638 |
| 7,371,690 B2 * | 5/2008 | Negishi et al. | 438/714 |
| 7,405,161 B2 | 7/2008 | Jang et al. | |
| 8,110,342 B2 * | 2/2012 | Liu et al. | 430/313 |
| 8,614,151 B2 * | 12/2013 | Benson et al. | 438/720 |
| 2001/0005634 A1 * | 6/2001 | Kajiwara | 438/706 |
| 2002/0130349 A1 | 9/2002 | McClure et al. | |
| 2003/0036287 A1 * | 2/2003 | Ding et al. | 438/723 |
| 2004/0048489 A1 * | 3/2004 | Ichihashi et al. | 438/723 |
| 2004/0053505 A1 * | 3/2004 | Chinn et al. | 438/710 |
| 2006/0068592 A1 * | 3/2006 | Dostalik | 438/706 |
| 2006/0205238 A1 * | 9/2006 | Chinn et al. | 438/792 |
| 2006/0264033 A1 * | 11/2006 | Olmen et al. | 438/637 |
| 2007/0122753 A1 | 5/2007 | Jang | |
| 2008/0286698 A1 | 11/2008 | Zhuang et al. | |
| 2009/0176375 A1 | 7/2009 | Benson et al. | |
| 2011/0215409 A1 | 9/2011 | Li et al. | |

* cited by examiner

LOW ENERGY ETCH PROCESS FOR NITROGEN-CONTAINING DIELECTRIC LAYER

BACKGROUND

The present disclosure relates to semiconductor processing methods, and particularly to methods for anisotropically etching a nitrogen-containing dielectric layer at low energy, and structures for effecting the same.

"Trench-first" BEOL applications suffer issues due to residue formation with exposed metal surfaces, metallic hardmask retention, and damage to low-k materials such as organosilicate glass throughout the pattern transfer process. Residual fluorine is usually linked to residue formation as well as low-k damage. However, residual fluorine is needed to provide sufficient etch rate for the material of a cap layer during the final stage of the pattern transfer process.

Increasing hard mask retention through process optimization is challenging. Thus, there is a lower limit on the initial thickness of the hard mask that can be employed for adequate lithography process window.

Deposition of removable sidewall polymer deposition to impede damage to the low-k materials has been extensively attempted. The removable sidewall polymer deposit fills the periphery of an opening formed during an anisotropic etch process. The removable sidewall polymer deposit is removed, by a wet etch or a dry etch, during subsequent etching processing steps once the bottom of the trench is reached at the end of the anisotropic etch process. The requirement for removal of the sidewall polymer deposition severely limits the etching process window for the anisotropic etch, and effective increases the minimum dimension of a via hole that can be formed by the anisotropic etch.

Thus, an anisotropic etch process is desired that does not fill a periphery of a via hole with a polymer and provide protection to the low-k materials at the same time.

BRIEF SUMMARY

A stack that includes, from bottom to top, a nitrogen-containing dielectric layer, an interconnect level dielectric material layer, and a hard mask layer is formed on a substrate. The hard mask layer and the interconnect level dielectric material layer are patterned by an etch. Employing the patterned hard mask layer as an etch mask, the nitrogen-containing dielectric layer is patterned by a break-through anisotropic etch, which employs a fluorohydrocarbon-containing plasma to break through the nitrogen-containing dielectric layer. Fluorohydrocarbon gases used to generate the fluorohydrocarbon-containing plasma generate a carbon-rich polymer residue, which interact with the nitrogen-containing dielectric layer to form volatile compounds. Plasma energy can be decreased below 100 eV to reduce damage to physically exposed surfaces of the interconnect level dielectric material layer.

According to an aspect of the present disclosure, a method of forming a metal interconnect structure is provided. The method includes: forming a stack including, from bottom to top, a substrate, a nitrogen-containing dielectric layer, an interconnect level dielectric material layer, and a hard mask layer; forming an opening within the hard mask layer and the low-k dielectric material layer; and anisotropically etching a physically exposed portion of the nitrogen-containing dielectric layer underneath the opening employing a fluorohydrocarbon-containing plasma. A volatile compound is formed on, and evaporates from, a surface of the nitrogen-containing dielectric layer. The volatile compound includes nitrogen derived from the nitrogen-containing dielectric layer and a carbon-rich polymer including carbon and fluorine and having a ratio of carbon to fluorine that is greater than 1.

According to another aspect of the present disclosure, a structure is provided, which includes: a stack including, from bottom to top, a substrate, a nitrogen-containing dielectric layer, an interconnect level dielectric material layer, and a hard mask layer; an opening present within the hard mask layer and the low-k dielectric material layer and extending downward into at least an upper portion of the nitrogen-containing dielectric layer; and a volatile compound located on a surface of the nitrogen-containing dielectric layer within in the opening. The volatile compound includes nitrogen and a carbon-rich polymer including carbon and fluorine and having a ratio of carbon to fluorine that is greater than 1.

DETAILED DESCRIPTION

Figure 1:
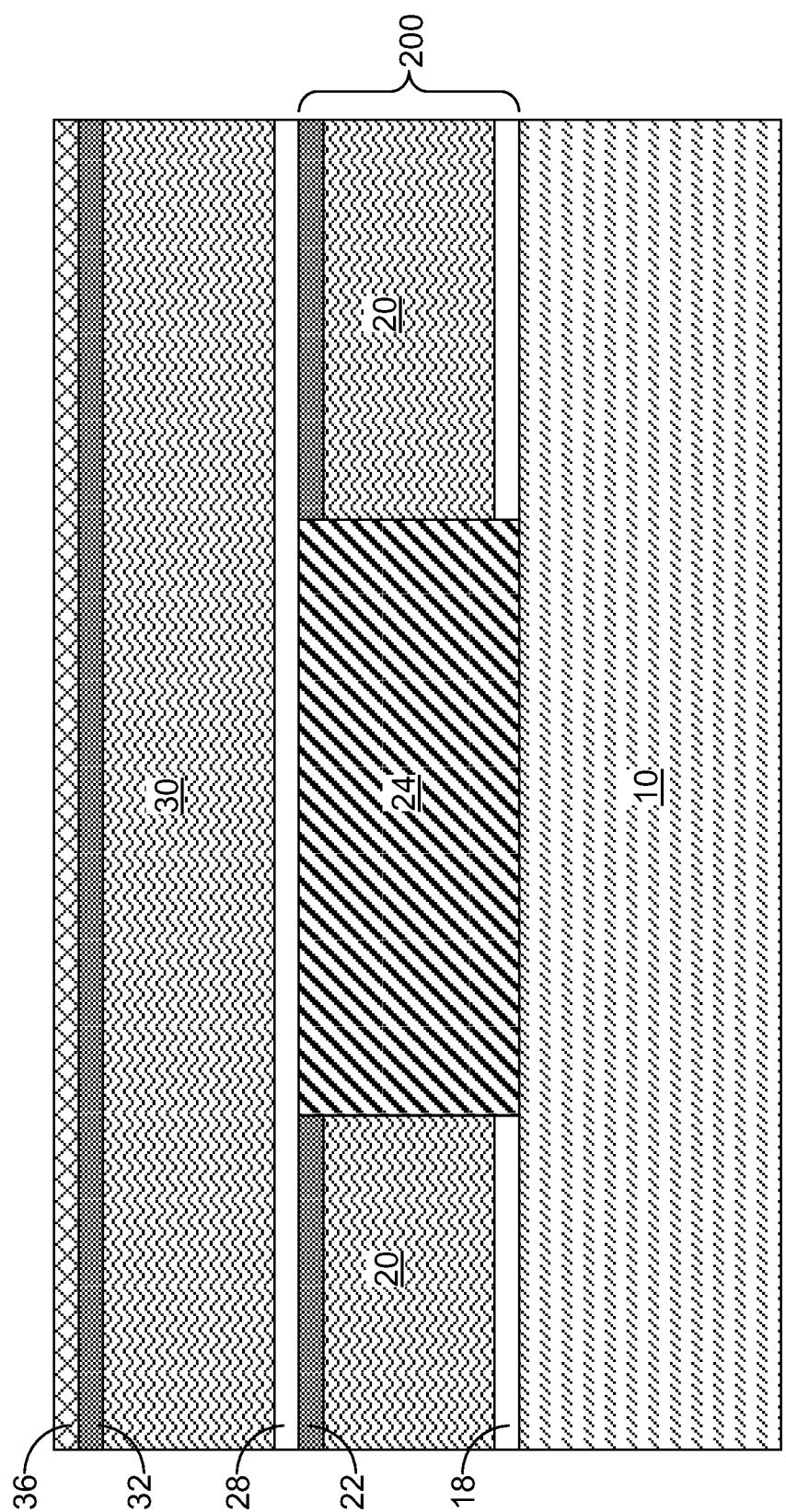
FIG. 1 is a vertical cross-sectional view of a first exemplary structure after formation of a stack including a substrate, a nitrogen-containing dielectric layer, an interconnect level dielectric layer, a dielectric cap layer, and a metallic hard mask layer according to a first embodiment of the present disclosure.

As stated above, the present disclosure relates to methods for anisotropically etching a nitrogen-containing dielectric layer at low energy, and structures for effecting the same, which are now described in detail with accompanying figures. Throughout the drawings, the same reference numerals or letters are used to designate like or equivalent elements. The drawings are not necessarily drawn to scale.

Referring to FIG. 1, a first exemplary structure according to a first embodiment of the present disclosure includes a vertical material stack. The vertical material stack includes a substrate 10, an optional underling metal interconnect level structure 200, a nitrogen-containing dielectric layer 28, an interconnect level dielectric layer 30, a dielectric cap layer 32, and a metallic hard mask layer 36.

The substrate 10 can include a semiconductor material, an insulator material, a conductive material, or a combination thereof. The semiconductor material can be an elemental semiconductor material such as silicon, germanium, carbon, or an alloy thereof, a III-V compound semiconductor material, a II-VI compound semiconductor material, or any combination or stack thereof. The semiconductor material can be doped with electrical dopants such as B, Ga, In, P, As, and Sb. Multiple semiconductor materials can be present in the substrate. The insulator material can be doped or undoped silicon oxide, doped derivatives of silicon oxide, silicon nitride, silicon oxynitride, a dielectric metal oxide having a dielectric constant greater than 3.9, or a combination or stack thereof. Multiple insulator materials can be present in the substrate 10. The conductive material can include a metallic material such as Cu, W, Ti, Ta, Al, WN, TiN, TaN, WC, TiC, TiC, or alloys thereof. The substrate 10 can include at least one semiconductor device (not shown) such as a field effect transistor, a junction transistor, a diode, a thyristor, a capacitor, an inductor, or any other semiconductor device or optical device known in the art. Further, the substrate 10 can include a contact-level dielectric material layer and contact via structures embedded therein.

If present, the optional underling metal interconnect level structure 200 includes at least one conductive structure 24 and at least one underlying dielectric layer in each line level and in each via level. The optional underlying metal interconnect level structure 200 can include one or more line levels and/or one or more via levels. Each line level includes at least one conductive line structure providing a lateral conductive path. Each via level includes at least one conductive via structure providing a vertical conductive path. The at least one conductive structure 24 includes the at least one conductive line structure in the one or more line levels, and the at least one conductive via structure in the one or more via levels.

The at least one underlying dielectric layer in a line level or in a via level can include doped or undoped silicon oxide (i.e., doped silicate glass or undoped silicate glass), silicon nitride, organosilicate glass that includes Si, C, O, H, and optionally N, a dielectric metal oxide, or a combination thereof. For example, an underlying dielectric layer can include a stack, from bottom to top, of an underlying silicon nitride layer 18, an underlying interconnect level dielectric layer 20 including a porous or non-porous organosilicate glass, and a dielectric cap layer 22 including silicon nitride or a nitrogen-doped organosilicate glass.

The nitrogen-containing dielectric layer 28 includes a dielectric material that contains nitrogen. Exemplary dielectric materials that contain nitrogen that can be employed for the nitrogen-containing dielectric layer 28 include, but are not limited to, silicon nitride, silicon oxynitride, a dielectric material having a dielectric constant less than 3.9 and including nitrogen, a dielectric metal oxynitride, or a combination thereof. The thickness of the nitrogen-containing dielectric layer 28 can be from 1 nm to 30 nm, although lesser and greater thicknesses can also be employed.

Silicon nitride that can be employed for the nitrogen-containing dielectric layer 28 can be a stoichiometric silicon nitride having the atomic ratio of 3:4 between silicon and nitrogen, or can be a non-stoichiometric silicon nitride. The silicon nitride in the nitrogen-containing dielectric layer 28 can be formed, for example, by chemical vapor deposition (CVD), and may, or may not, be treated with ultraviolet radiation and/or with thermal treatment.

Silicon oxynitride that can be employed for the nitrogen-containing dielectric layer 28 has a composition of $SiO_xN_y$, in which x is a positive number greater than 0 and less than 2, and y is a positive number greater than 0 and less than 4/3. The silicon oxynitride in the nitrogen-containing dielectric layer 28 can be formed, for example, by deposition of a silicon oxynitride by chemical vapor deposition, by deposition of silicon nitride followed by thermal oxidation or plasma oxidation, or by deposition of silicon oxide followed by thermal nitridation or plasma nitridation.

Dielectric materials having a dielectric constant less than 3.9 are referred to as low dielectric constant (low-k) dielectric materials. Nitrogen-containing low-k dielectric materials that can be employed for the nitrogen-containing dielectric layer 28 include, but are not limited to, a nitrogen-containing organosilicate glass. The nitrogen-containing organosilicate glass includes Si, C, O, H, and N. An exemplary nitrogen-containing organosilicate glass is NBLoK™ that is commercially available from Applied Materials, Inc. The nitrogen-containing low-k dielectric material that is employed for the nitrogen-containing dielectric layer 28 can be deposited, for example, by chemical vapor deposition.

Dielectric metal oxynitrides that can be employed for the nitrogen-containing dielectric layer 28 include, but are not limited to, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and an alloy thereof. Each value of x is independently from 0.5 to 3 and each value of y is independently from 0 to 2.

The interconnect level dielectric layer 30 includes a dielectric material such as silicon oxide, silicon nitride, or a low-k dielectric material such as organosilicate glass including at least Si, C, O, and H, and optionally N. The silicon oxide includes spin-on-oxide (SOG), undoped silicon oxide (undoped silicate glass), and doped silicon oxide (i.e., doped silicate glass) such as fluorosilicate glass (FSG), phosphosilicate glass (PSG), borosilicate glass (BSG), and borophosphosilicate glass (BPSG). The interconnect level dielectric layer 30 can be deposited, for example, by plasma enhanced chemical vapor deposition (PECVD) or spin coating. The thickness of the interconnect level dielectric layer 30 can be from 30 nm to 600 nm, although lesser and greater thicknesses can also be employed.

In one embodiment, the interconnect level dielectric layer 30 includes a porous or non-porous organosilicate glass having a dielectric constant less than 2.8 and including Si, C, O, and H. The porous or non-porous organosilicate glass can be deposited, for example, by plasma enhanced chemical vapor deposition (PECVD).

The dielectric cap layer 32 includes a non-porous dielectric material such as silicon oxide, silicon nitride, silicon oxynitride, a dielectric metal oxide, or a combination thereof. The dielectric cap layer 32 can be formed, for example, by plasma enhanced chemical vapor deposition (PECVD). The thickness of the dielectric cap layer 32 can be from 5 nm to 300 nm, although lesser and greater thicknesses can also be employed.

The metallic hard mask layer 36 includes a metallic material such as WN, TiN, TaN, WC, TiC, TiC, or stacks or alloys thereof. The metallic dielectric cap layer 36 can be formed, for example, by physical vapor deposition (PVD) or chemical vapor deposition (CVD). The thickness of the metallic hard mask layer 36 can be from 5 nm to 300 nm, although lesser and greater thicknesses can also be employed.

Figure 2:
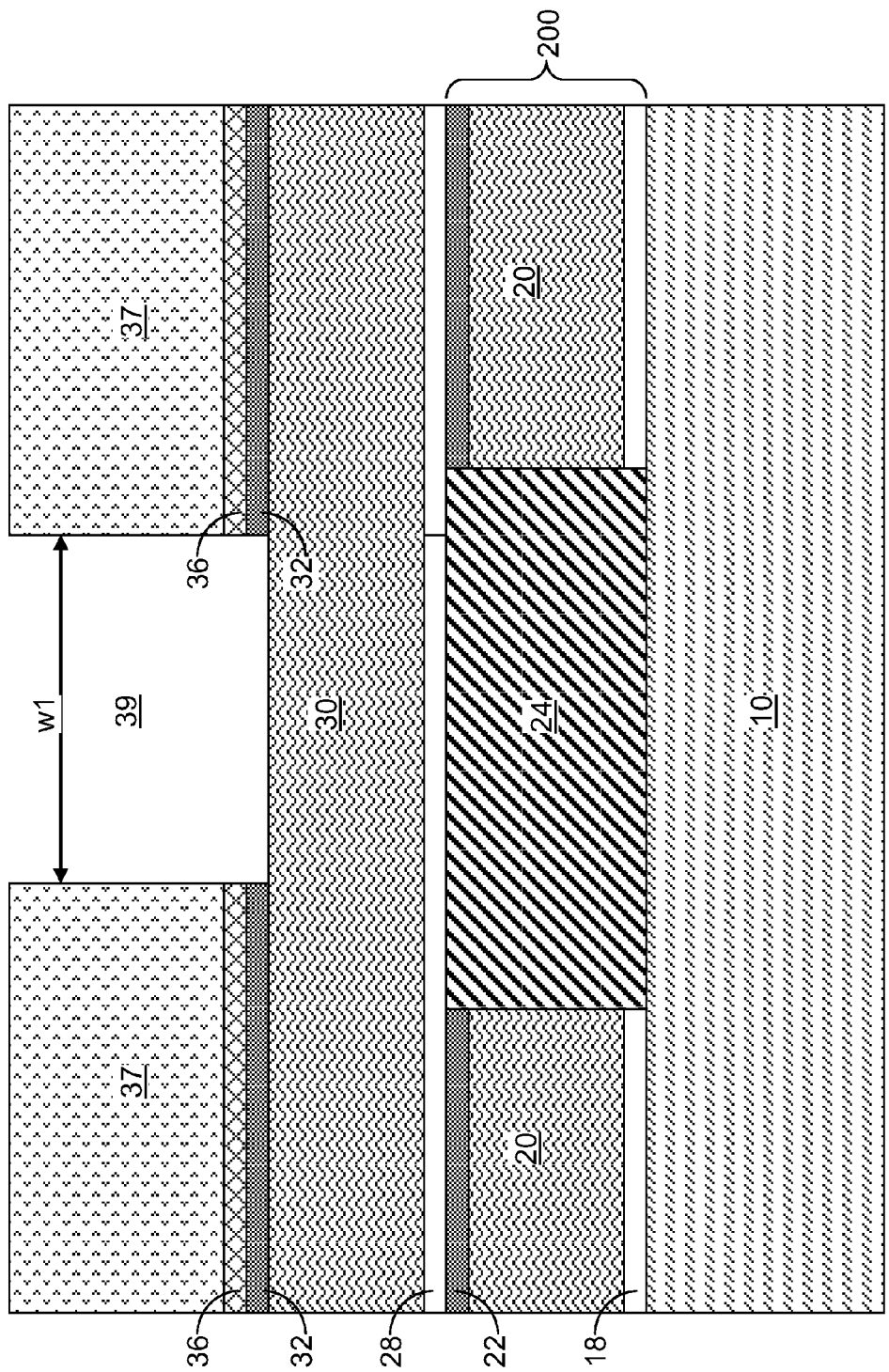
FIG. 2 is a vertical cross-sectional view of the first exemplary structure after application and lithographic patterning of a photoresist, and transfer of the pattern in the photoresist into the metallic hard mask layer and the dielectric cap layer according to the first embodiment of the present disclosure.

Referring to FIG. 2, a photoresist 37 is formed either directly on the top surface of the metallic hard mask layer 36. The photoresist 37 may be formed, for example, by spin coating. The photoresist 37 can be a deep ultraviolet (DUV) photoresist, a mid-ultraviolet (MUV) photoresist, an extreme ultraviolet (EUV) photoresist, or an electron beam (e-beam) photoresist. The material of the photoresist 37 reacts to illumination by light in a wavelength range or electron irradiation, and is chemically changed, for example, by cross-linking. The thickness of the photoresist 37 can be from 30 nm to 600 nm, and typically from 60 nm to 300 nm, although lesser and greater thicknesses can also be employed.

The photoresist 37 is lithographically exposed, and is subsequently developed. An opening having a first width w1 is formed within the photoresist 37 after the lithographic exposure and development. A top surface of the metallic hard mask layer 36 is physically exposed at the bottom of the opening in the photoresist 37. The pattern in the photoresist 37 includes, for example, an opening 39 having a first width w1, which is determined by the lithographic exposure conditions.

The pattern in the photoresist 37 is transferred into the metallic hard mask layer 36 and the dielectric cap layer 32 by at least one etch. The at least one etch can include an anisotropic etch such as a reactive ion etch, or an isotropic etch such as a wet etch.

In one embodiment, the pattern in the photoresist 37 is transferred into the metallic hard mask layer 36 by a first anisotropic etch that etches the metallic material of the metallic hard mask layer 36 employing the photoresist 37 as an etch mask. The pattern in the metallic hard mask layer 36 is then transferred into the dielectric hard mask layer 32 employing a second anisotropic etch that etches the dielectric material of the dielectric hard mask layer 32.

The photoresist 37 is subsequently removed, for example, by ashing.

Figure 3:
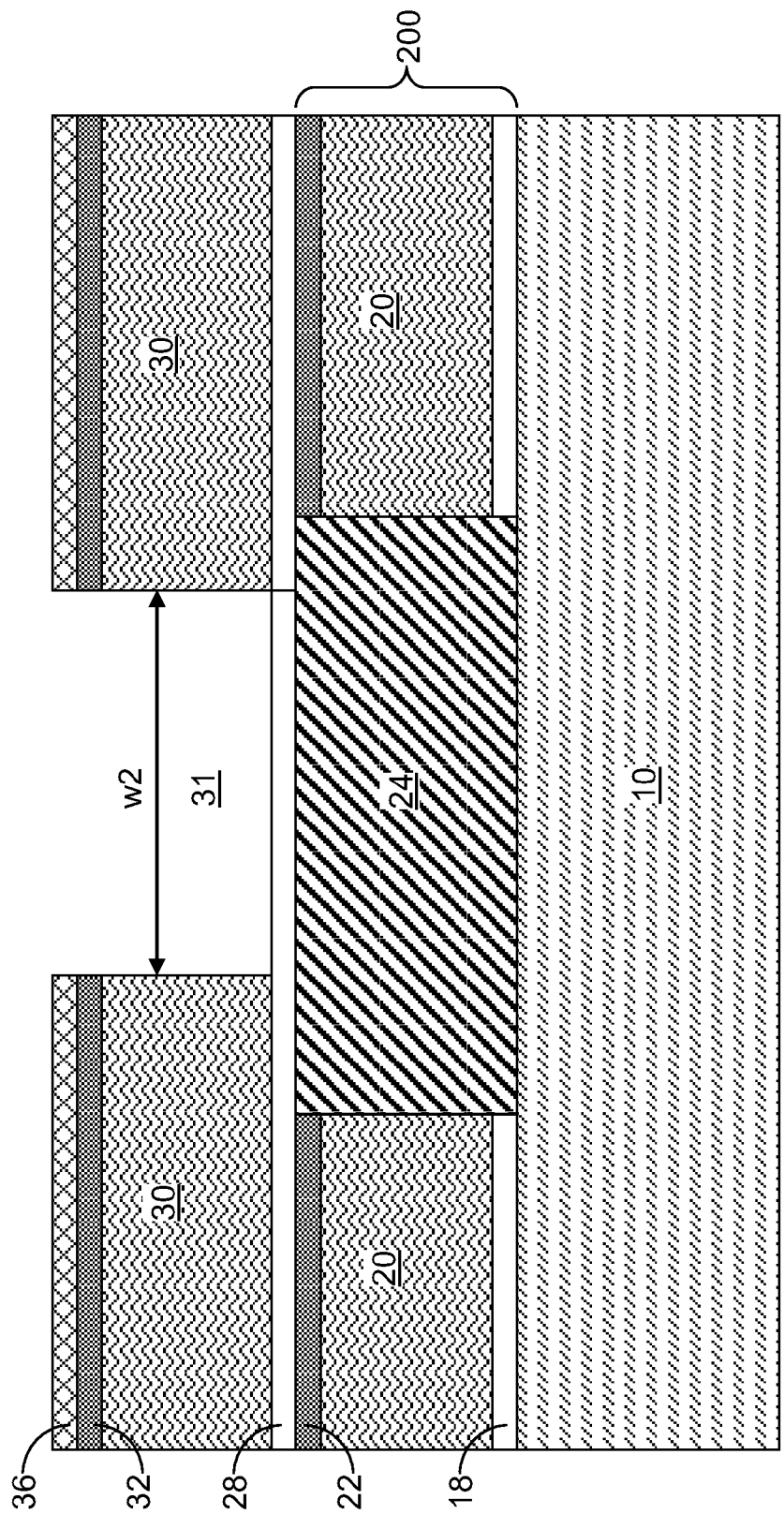
FIG. 3 is a vertical cross-sectional view of the first exemplary structure after removal of the photoresist, and transfer of the pattern in the metallic hard mask layer into the interconnect level dielectric layer according to the first embodiment of the present disclosure.

Referring to FIG. 3, an anisotropic etch is performed to transfer the pattern in the metallic hard mask layer 36 into the interconnect level dielectric layer 30. An opening, which is herein referred to as a cavity 31, having a second width w2 and extending from the top surface of the metallic hard mask layer 36 to the bottom of the interconnect level dielectric layer 30, is formed by the anisotropic etch.

The anisotropic etch can employ a plasma of etchants. The species for the etchants can be selected based on the composition of the dielectric material in the interconnect level dielectric layer 30 and the selectivity of the anisotropic etch to the metallic material of the metallic hard mask layer 36, i.e., the ratio of the thickness of removed dielectric material(s) of the interconnect level dielectric layer 30 to the thickness of the removed metallic material(s) of the metallic hard mask layer 36. In one embodiment, a selectivity greater than 10 can be achieved if the interconnect level dielectric layer 30 includes an organosilicate glass, and the metallic hard mask layer 36 includes a metallic nitride such as TaN, TiN, and/or WN and/or a metallic carbide such as TaC, TiC, and/or WC.

Figure 4:
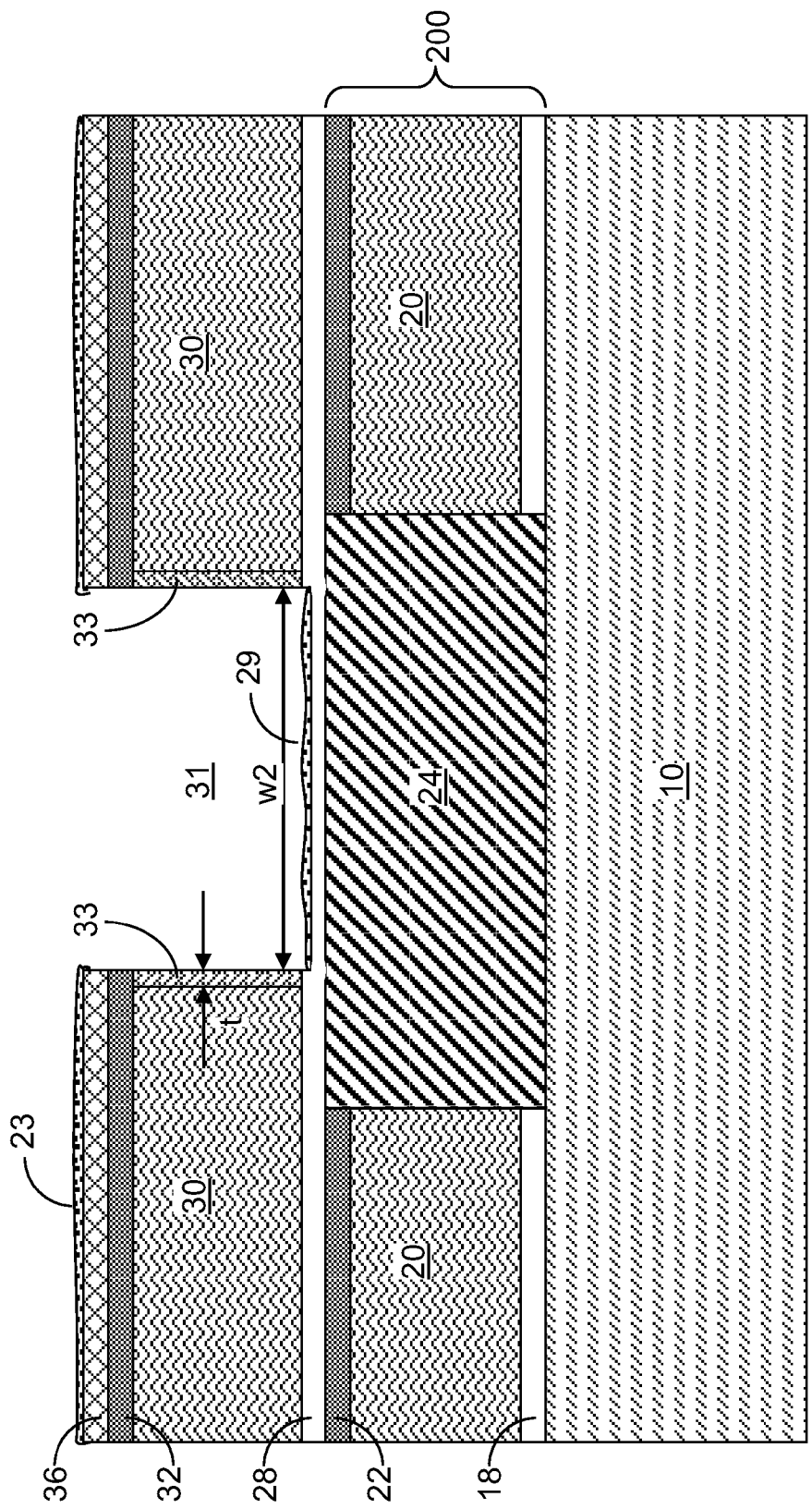
FIG. 4 is a vertical cross-sectional view of the first exemplary structure during an anisotropic etch of the nitrogen-containing dielectric layer according to the first embodiment of the present disclosure.

Referring to FIG. 4, the first exemplary structure is placed into a process chamber configured for a plasma etch, i.e., a reactive ion etch. An anisotropic etch employing a fluorohydrocarbon-containing plasma is performed on the first exemplary structure. The pattern in the metallic hard mask layer 36 is transferred into an upper portion of the nitrogen-containing dielectric layer 28 during the initial phase of the anisotropic etch.

The composition of the gas supplied into the process chamber includes one or more fluorohydrocarbon gas (hereafter referred to as "the fluorohydrocarbon gas") having a composition of $C_xH_yF_z$, wherein x is an integer selected from 3, 4, 5, and 6, y and z are positive integers, and y is greater than z. For example, the fluorohydrocarbon gas include one or more of $C_3H_5F_3$, $C_3H_6F_2$, $C_3H_7F$, $C_3H_4F_2$, $C_3H_5F$, $C_3H_3F$, $C_4H_6F_4$, $C_4H_7F_3$, $C_4H_8F_2$, $C_4H_9F$, $C_4H_5F_3$, $C_4H_6F_2$, $C_4H_7F$, $C_4H_4F_2$, $C_4H_5F$, $C_5H_7F_5$, $C_5H_8F_4$, $C_5H_9F_3$, $C_5H_{10}F_2$, $C_5H_{11}F$, $C_5H_6F_4$, $C_5H_7F_3$, $C_5H_8F_2$, $C_5H_9F$, $C_5H_5F_3$, $C_5H_6F_2$, $C_5H_7F$, $C_6H_8F_6$, $C_6H_9F_5$, $C_6H_{10}F_4$, $C_6H_{11}F_3$, $C_6H_{12}F_2$, $C_6H_{13}F$, $C_6H_7F_5$, $C_6H_8F_4$, $C_6H_9F_3$, $C_6H_{10}F_2$, $C_6H_{11}F$, $C_6H_6F_4$, $C_6H_7F_3$, $C_6H_8F_2$, and $C_6H_9F$. Correspondingly, the fluorohydrocarbon-containing plasma includes ions of $C_xH_yF_z$. Optionally, the composition of the gas supplied into the process chamber can include $O_2$, $N_2$, Ar, CO, and/or $CO_2$. In other words, the fluorohydrocarbon-containing plasma optionally includes a plasma of oxygen.

Non-limiting specific examples of $C_xH_yF_z$, wherein x is an integer selected from 3, 4, 5, and 6, y and z are positive integers, and y is greater than z, include alkanes, alkenes, and alkynes.

In one embodiment, the fluorohydrocarbon gas can include one or more alkane fluorohydrocarbon gas having the formula of $C_xH_yF_z$, wherein x is an integer selected from 3, 4, and 5, y and z are positive integers, and y is greater than z. The one or more alkane fluorohydrocarbon gas can include, but are not limited to: saturated liner fluorohydrocarbons shown by $C_3H_7F$ such as 1-fluoropropane, 2-fluoropropane; saturated liner fluorohydrocarbons shown by $C_3H_6F_2$ such as 1,1-difluoropropane, 2,2-difluoropropane, 1,2-difluoropropane, 1,3-difluoropropane; saturated liner fluorohydrocarbons shown by $C_3H_5F_3$ such as 1,1,1-trifluoropropane, 1,1,2-trifluoropropane, 1,1,3-trifluoropropane, 1,2,2-trifluoropropane; saturated cyclic fluorohydrocarbon shown by $C_3H_5F$ such as fluorocyclopropane; saturated cyclic fluorohydrocarbon shown by $C_3H_4F_2$ such as 1,2-difluorocycloproapne;

saturated liner fluorohydrocarbons shown by $C_4H_9F$ such as 1-fluorobutane, 2-fluorobutane; saturated liner fluorohydrocarbons shown by $C_4H_8F_2$ such as 1-fluoro-2-methylpropane, 1,1-difluorobutane, 2,2-difluorobutane, 1,2-difluorobutane, 1,3-difluorobutane, 1,4-difluorobutane, 2,3-difluorobutane, 1,1-difluoro-2-methylpropane, 1,2-difluoro-2-methylpropane, 1,3-difluoro-2-methylpropane; saturated liner fluorohydrocarbons shown by $C_4H_7F_3$ such as 1,1,1-trifluorobutane, 1,1,1-trifluoro-2-methylpropane, 1,1,2-trifluorobutane, 1,1,3-trifluorobutane, 1,1,4-trifluorobutane, 2,2,3-trifluorobutane, 2,2,4-trifluorobutane, 1,1,2-trifluoro-2-methylpropane; saturated liner fluorohydrocarbons shown by $C_4H_6F_4$ such as 1,1,1,2-tetrafluorobutane, 1,1,1,3-tetrafluorobutane, 1,1,1,4-tetrafluorobutane, 1,1,2,2-tetrafluorobutane, 1,1,2,3-tetrafluorobutane, 1,1,2,4-tetrafluorobutane, 1,1,3,3-tetrafluroobutane, 1,1,3,4-tetrafluorobutane, 1,1,4,4-tetrafluorobutane, 2,2,3,3-tetrafluorobutane, 2,2,3,4-tetrafluorobutane, 1,2,3,4-tetrafluorobutane, 1,1,1,2-tetrafluoro-2-methylpropane, 1,1,1,3-tetrafluoro-2-methylpropane, 1,1,2,3-tetrafluoro-2-methylpropane, 1,1,3,3-tetrafluoro-2-methylpropane; saturated cyclic fluorohydrocarbon shown by $C_4H_7F$ such as fluorocyclobutane; saturated cyclic fluorohydrocarbons shown by C4H6F2 such as 1,1-difluorocyclobutane, 1,2-difluorocyclobutane, 1,3-difluorocyclobutane; saturated cyclic fluorohydrocarbon shown by $C_4H_5F_3$ such as 1,1,2-trifluorocyclobutane, 1,1,3-triflurocyclobutane; saturated liner fluorohydrocarbons shown by $C_5H_{11}F$ such as 1-fluoropentane, 2-fluoropentane, 3-fluoropentane, 1-fluoro-2-methylbutane, 1-fluoro-3-methylbutane, 2-fluoro-3-methylbutane, 1-fluoro-2,2-dimethylpropane; saturated liner fluorohydrocarbons shown by $C_5H_{10}F_2$ such as 1,1-difluoropenatne, 2,2-difluoropentane, 3,3-difluoropentane, 1,2-difluoropentane, 1,3-difluoropentane, 1,4-difluoropentane, 1,5-difluoropentane, 1,1-difluoro-2-methylbutane, 1,1-difluoro-3-methylbutane, 1,2-difluoro-2-methylbutane, 1,2-difluoro-3-methylbutane, 1,3-difluoro-2-methylbutane, 1,3-difluoro-3-methylbutane, 1,4-difluoro-2-methylbutane, 2,2-difluoro-3-methylbutane, 2,3-difluoro-2-methylbutane, 1,1-difluoro-2,2-dimethylpropane, 1,3-difluoro-2,2-dimethylproapne, 1-fluoro-2-fluoromethylbutane; saturated liner fluorohydrocarbons shown by $C_5H_9F_3$ such as 1,1,1-trifluoropentane, 1,1,2-trifluoropentane, 1,1,3-trifluoropentane, 1,1,4-trifluoropentane, 1,1,1-trifluoro-2-methylbutane, 1,1,2-trifluoro2,3-dimethylpropane; saturated cyclic fluorohydrocarbons shown by $C_5H_9F$ such as fluorocyclopentane, 1-fluoro-2-methylcyclobutane, 1-fluoro-3-methylcyclobutane, (fluoromethyl)-cyclobutane; saturated cyclic fluorohydrocarbons shown by $C_5H_8F_2$ such as 1,2-difluorocyclopentane, 1,3-difluorocyclopentane, 1,1-difluoro-2-methylcyclobutane, 1,1-difluoro-3-methylcyclobutane; saturated cyclic fluorohydrocarbons shown by $C_5H_7F_3$ such as 1,1,2-trifluorocyclopentane, 1,2,3,-trifluorocyclopentane.

Additionally or alternatively, the fluorohydrocarbon gas can include one or more alkene fluorohydrocarbon gas having the formula of $C_xH_yF_z$, wherein x is an integer selected from 3, 4, and 5, y and z are positive integers, and y is greater than z. The one or more alkene fluorohydrocarbon gas can include, but are not limited to: unsaturated liner fluorohydrocarbons shown by $C_3H_5F$ such as 3-fluoropropene, 1-fluoropropene, 2-fluoropropene; unsaturated liner fluorohydrocarbons shown by $C_3H_4F_2$ such as 1,1-difluoropropene, 3,3-difluoropropene; unsaturated cyclic fluorohydrocarbons shown by C3H3F such as 3-fluorocyclopropene, 1-fluorocyclopropene; unsaturated liner fluorohydrocarbons shown by $C_4H_7F$ such as 1-fluorobutene, 2-fluorobutene, 3-fluorobutene, 4-fluorobutene, 1-fluoro-2-butene, 2-fluoro-2-butene, 1-fluoro-2-methylpropene, 3-fluoro-2-methylpropene, 2-(fluoromethyl)-propene; unsaturated liner fluorohydrocarbons shown by $C_4H_6F_2$ such as 1,1-difluoro-2-methylpropene, 3,3-difluoro-2-methylpropene, 2-(fluoromethyl)-fluoropropene, 3,3-difluorobutene, 4,4-difluorobutene, 1,2-difluorobutene, 1,1-difluoro-2-butene, 1,4-difluoro-2-butene; unsaturated liner fluorohydrocarbons shown by $C_4H_5F_3$ such as 4,4,4-trifluorobutene, 3,3,4-trifluorobutene, 1,1,1-trifluoro-2-butene, 1,1,4-trifluoro-2-butene; unsaturated cyclic fluorohydrocarbons shown by $C_4H_5F$ such as 1-fluorocyclobutene, 3-fluorocyclobutene; unsaturated cyclic fluorohydrocarbons shown by $C_4H_4F_2$ such as 3,3-difluorocyclobutene, 3,4-difluorocyclobutene; unsaturated liner fluorohydrocarbons shown by $C_5H_9F$ such as 1-fluoropentene, 2-fluoropenten, 3-fluoropenten, 4-fluoropentene, 5-fluoropenten, 1-fluoro-2-pentene, 2-fluoro-2-pentene, 3-fluoro-2-pentene, 4-fluoro-2-pentene, 5-fluoro-2-pentene, 1-fluoro-2-methylbutene, 1-fluoro-3-methylbutene, 3-fluoro-2-methylbutene, 3-fluoro-3-methylbutene, 4-fluoro-2-methylbutene, 4-fluoro-3-methylbutene, 1-fluoro-2-methyl-2-butene, 1-fluoro-3-methyl-2-butene, 2-fluoro-3-methyl-2-butene, 2-(fluoromethyl)-butene; unsaturated liner fluorohydrocarbons shown by $C_5H_8F_2$ such as 3,3-difluoropentene, 4,4-difluoropentene, 5,5-difluoropentene, 1,2-difluoropentene, 3,4-difluoropentene, 3,5-difluoropentene, 4,5-difluoropentene; unsaturated cyclic fluorohydrocarbons shown by $C_5H_7F$ such as 1-fluorocyclopentene, 3-fluorocylopentene, 4-fluorocyclopentene; unsaturated cyclic fluorohydrocarbons shown by $C_5H_6F_2$ such as 3,3-difluorocyclopentene, 4,4-difluorocyclopentene, 1,3-difluorocyclopentene, 1,4-difluorocyclopentene, 3,5-difluorocyclopentene.

Additionally or alternatively, the fluorohydrocarbon gas can include one or more alkyne fluorohydrocarbon gas having the formula of $C_xH_yF_z$, wherein x is an integer selected from 3, 4, and 5, y and z are positive integers, and y is greater than z. The one or more alkyne fluorohydrocarbon gas can include, but are not limited to: unsaturated liner fluorohydrocarbon shown by $C_3H_3F$ such as 3-fluoropropyne; unsaturated liner fluorohydrocarbon shown by $C_3H_2F_2$ such as 3,3-difluoropropyne; unsaturated liner fluorohydrocarbons shown by $C_4H_5F$ such as 3-fluorobutyne, 4-fluorobutyne, 1-fluoro-2-butyne; unsaturated liner fluorohydrocarbons shown by $C_4H_4F_2$ such as 3,3-difluorobutyne, 4,4-difluorobutyne, 3,4-difluorobutyne, 1,4-difluoro-2-butyne; unsaturated liner fluorohydrocarbons shown by $C_5H_7F$ such as 3-fluoropentyne, 4-fluoropentyne, 5-fluoropentyne, 1-fluoro-2-pnetyne, 4-fluoro-2-pentyne, 5-fluoro-2-pentyne, 3-(fluoromethyl)-butyne; unsaturated liner fluorohydrocarbons shown by $C_5H_6F_2$ such as 3,3-difluoropentyne, 4,4-difluoropentyne, 5,5-difluoropentyne, 3,4-difluoropentyne, 4,5-difluoropentyne, 1,1-difluoro-2-pentyne, 4,4-difluor-2-pentyne, 5,5-difluoro-2-pentyne, 4,5-difluoro-2-pentyne, 3-(difluoromethyl)-butyne, 3-(fluoromethyl)-4-fluorobutyne.

The fluorohydrocarbon-containing plasma generates a fluorohydrocarbon-containing polymer during the anisotropic etch. The fluorohydrocarbon-containing polymer is deposited on the recessed surface of the nitrogen-containing dielectric layer 28 to form a first fluorohydrocarbon-containing polymer portion 29, and on the top surface of the metallic hard mask layer 36 to form a second fluorohydrocarbon-containing polymer portion 23. The fluorohydrocarbon-containing polymer in the first fluorohydrocarbon-containing polymer portion 29 and the second fluorohydrocarbon-containing polymer portion 23 includes carbon, hydrogen, and fluorine. The atomic concentration of carbon in the fluorohydrocarbon-containing polymer is greater than the atomic concentration of fluorine in the fluorohydrocarbon-containing polymer.

The atomic concentration of carbon is greater than the atomic concentration of fluorine in the fluorohydrocarbon-containing polymer in the first fluorohydrocarbon-containing polymer portion 29 and the second fluorohydrocarbon-containing polymer portion 23. In other words, the atomic ratio of carbon to fluorine is greater than 1 in the fluorohydrocarbon-containing polymer. Thus, the fluorohydrocarbon-containing polymer in the first fluorohydrocarbon-containing polymer portion 29 and the second fluorohydrocarbon-containing polymer portion 23 is a "carbon-rich" polymer. As used herein, a fluorohydrocarbon-containing polymer is "carbon-rich" if the atomic concentration of carbon is greater than the atomic concentration of fluorine.

The fluorohydrocarbon-containing polymer includes hydrogen at an atomic concentration that is at least one half of the atomic concentration of carbon in the carbon-rich fluorohydrocarbon-containing polymer 33. In one embodiment, the atomic ratio of hydrogen to carbon in the fluorohydrocarbon-containing polymer is between 0.5 and 3.0.

The fluorohydrocarbon-containing polymer is a carbon-based polymer, i.e., more than 10% of all bonds therein are bonded to at least one carbon atom. In one embodiment, the fluorohydrocarbon-containing polymer in the first fluorohydrocarbon-containing polymer portion 29 and the second fluorohydrocarbon-containing polymer portion 23 includes carbon at an atomic concentration between 30% and 40%, hydrogen at an atomic concentration between 40% and 50%, fluorine at an atomic concentration between 5.0% and 10.0%, and oxygen at an atomic concentration less than 5%.

The physically exposed portion of the nitrogen-containing dielectric layer 28 is anisotropically etched underneath the cavity 31 by the fluorohydrocarbon-containing plasma. An opening, i.e., the cavity 31, is present within the metallic hard mask layer 36, the dielectric cap layer 32, and the interconnect level dielectric layer 30 and extends downward into at least the upper portion of the nitrogen-containing dielectric layer 28. The fluorohydrocarbon-containing polymer in the first fluorohydrocarbon-containing polymer portion 29 reacts with nitrogen atoms in the nitrogen-containing dielectric layer 22 to form a nitrogen-containing volatile compound.

As used herein, a compound is "volatile" if it evaporates in vacuum at 297.3 K. The nitrogen-containing volatile compound is formed on, volatilizes at, and evaporates from, the recessed surface of the nitrogen-containing dielectric layer 28. The nitrogen-containing volatile compound includes nitrogen derived from the nitrogen-containing dielectric layer and the carbon-rich fluorohydrocarbon-containing polymer of the first fluorohydrocarbon-containing polymer portion 29, which includes carbon and fluorine and has an atomic ratio of carbon to fluorine that is greater than 1.

The nitrogen-containing volatile compound has a general formula of $C_iH_jF_kN_l$, wherein i, j, k, and l are integers. The value for i can be from 1 to 6, the value for j can be from 0 to 8, the value for k can be from 0 to _6, and the value for l can be from 0 to 4, although lesser and greater values can be employed for each of i, j, k, and l. The nitrogen-containing volatile compound volatilizes, and is removed from, the recessed surface of the nitrogen-containing dielectric layer 22. In contrast, the fluorohydrocarbon-containing polymer in the second fluorohydrocarbon-containing polymer portion 23 does not react with the underlying metallic material of the metallic hard mask layer 36. The second fluorohydrocarbon-containing polymer portion 23 includes the same carbon-rich fluorohydrocarbon-containing polymer as the first fluorohydrocarbon-containing polymer portion 29, and does not include nitrogen.

Thus, the average thickness of the first fluorohydrocarbon-containing polymer portion 29 saturates at a steady-state thickness, which is herein referred to as a first thickness. The first thickness is typically from 0.2 nm to 1.0 nm, although lesser and greater thicknesses can also be employed depending on the composition and energy of the fluorohydrocarbon-containing plasma. Because the fluorohydrocarbon-containing polymer in the second fluorohydrocarbon-containing polymer portion 23 does not react with the underlying metallic material of the metallic hard mask layer 36, the average thickness of the second fluorohydrocarbon-containing polymer portion 23 tends to continually increase with the progression of the anisotropic etch, or saturates at a thickness that is greater than the first thickness. The saturation value for the second thickness can be from 1 nm to 3 nm, although the saturation value can be lesser or greater depending on the composition and energy of the fluorohydrocarbon-containing plasma. The second thickness is greater than the first thickness throughout the duration of the anisotropic etch.

The quantity of the fluorohydrocarbon-containing polymer generated in this anisotropic etch tends to be profuse relative to conventional plasma processes employing ions of $CF_4$ or $CHF_3$ having comparable kinetic energy for the plasma because the source gases have a high atomic percentage of carbon and a high atomic percentage of hydrogen relative to $CF_4$ or $CHF_3$ employed in conventional anisotropic etch processes. For example, the quantity of the fluorohydrocarbon-containing polymer generated in this anisotropic etch is at least twice as much as, and in some embodiments ten or more times as much as, the amount of polymer generated in conventional plasma processes employing ions of $CF_4$ or $CHF_3$ having comparable kinetic energy. Thus, the energy of the fluorohydrocarbon-containing plasma of the present disclosure can be significantly lowered relative to the energy employed for conventional anisotropic etch processes. Specifically, while conventional plasma requires minimum ion energy of 200 eV, the ions in the fluorohydrocarbon-containing plasma of the present disclosure can have an energy less than 200 eV. The ions in the fluorohydrocarbon-containing plasma of the present disclosure can have an average kinetic energy between 10 eV and 1 keV. In one embodiment, the ions in the fluorohydrocarbon-containing plasma of the present disclosure can have an average kinetic energy in a range from 10 eV to 100 eV.

Due to the high carbon content and the high hydrogen content in the source gas(es) of the fluorohydrocarbon-containing plasma relative to the carbon content and the hydrogen content of conventional plasmas of $CF_4$ or $CHF_3$, the fluorohydrocarbon-containing polymer in the first fluorohydrocarbon-containing polymer portion 29 and the second fluorohydrocarbon-containing polymer portion 23 has different properties than polymers deposited in a plasma etch process employing $CF_4$ or $CHF_3$. For example, the fluorohydrocarbon-containing polymer in the first fluorohydrocarbon-containing polymer portion 29 and the second fluorohydrocarbon-containing polymer portion 23 has a refractive index in a range from 1.8 to 2.2, while polymers deposited in a plasma etch process employing $CF_4$ or $CHF_3$ have a refractive index in a range from 1.4-1.7. Further, the fluorohydrocarbon-containing polymer in the first fluorohydrocarbon-containing polymer portion 29 and the second fluorohydrocarbon-containing polymer portion 23 has a density in a range from 1.5 $g/cm^3$ to 1.8 $g/cm^3$, while polymers deposited in a plasma etch process employing $CF_4$ or $CHF_3$ have a density greater than 1.7 g/cm³ to 2.0 g/cm³. In one embodiment, the fluorohydrocarbon-containing polymer in the first fluorohydrocarbon-containing polymer portion 29 and the second fluorohydrocarbon-containing polymer portion 23 has a density in a range from 1.5 g/cm³ to 1.7 g/cm³.

In one embodiment, the interconnect level dielectric layer 30 includes a low-k dielectric material such as organosilicate glass, and the fluorohydrocarbon-containing plasma causes a structural damage to the physically exposed surfaces of the low-k dielectric material. Specifically, the chemical bonds among the molecules of the low-k dielectric material are partially damaged, and fluorine can be incorporated into the low-k dielectric material during the anisotropic etch to convert a vertical surface portion of the interconnect level dielectric layer 30 laterally surrounding the cavity 31 into a fluorine-containing damaged low-k material portion 33. The thickness t of the fluorine-containing damaged low-k material portion 33 can be from 2 nm to 20 nm, although lesser and greater thicknesses can also be employed. Due to the carbon-rich nature of the polymer, the thickness of the fluorine-containing damaged low-k material portion 33 is less than a thickness of a damaged low-k material portion formed in an anisotropic etch process employing a comparable $CF_4$ and/or $CHF_3$ plasmas.

Figure 5:
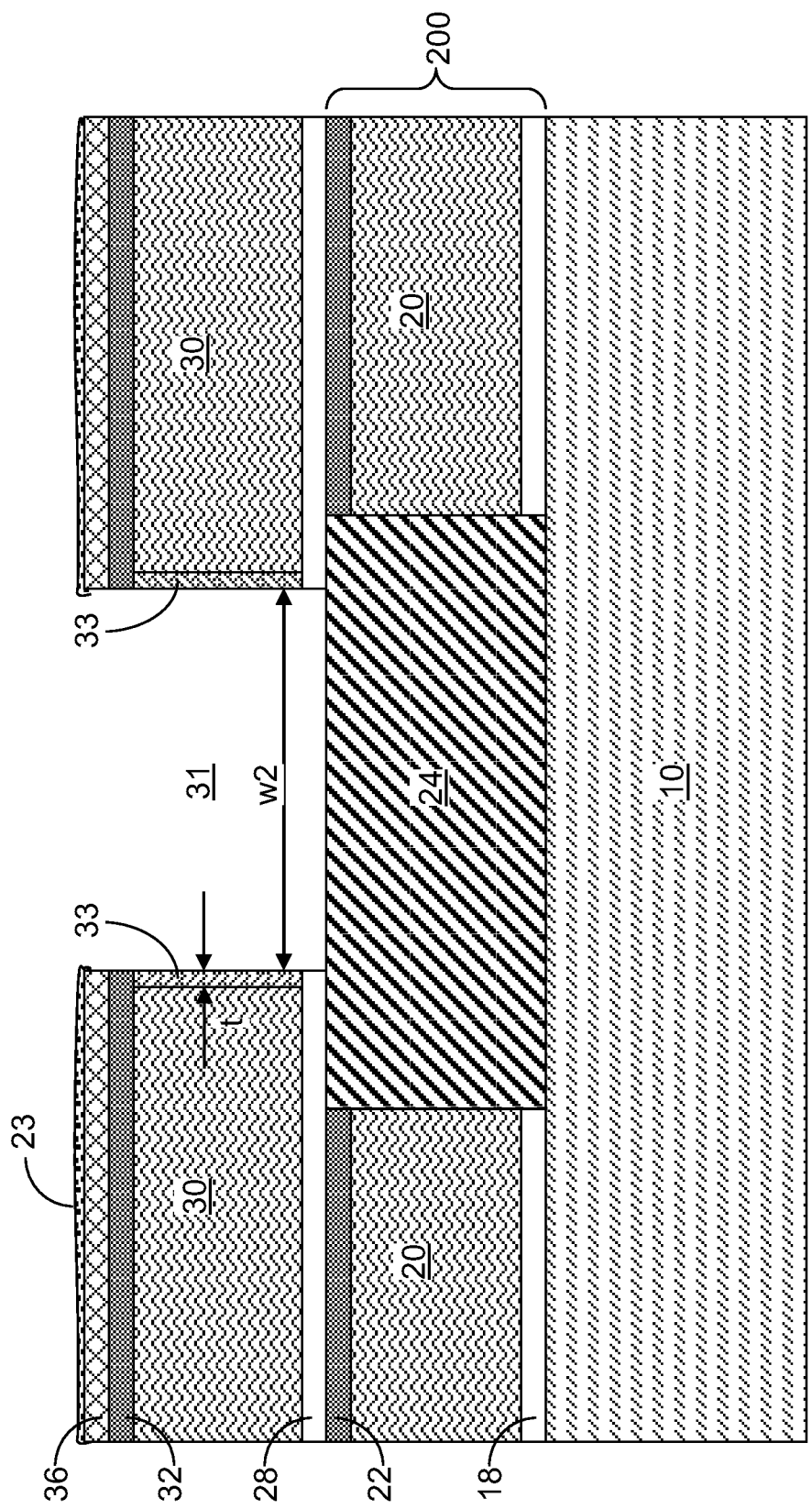
FIG. 5 is a vertical cross-sectional view of the first exemplary structure after the anisotropic etch according to the first embodiment of the present disclosure.

Referring to FIG. 5, the transfer of the pattern in metallic hard mask layer 36 proceeds to the bottom surface of the nitrogen-containing dielectric layer 28 as the anisotropic etch continues until a top surface of the substrate 10 or a top surface of the optional underlying metal interconnect level structure 200 is exposed. The substrate 10 or the optional underlying metal interconnect level structure 200 can be employed as an etch stop layer for the anisotropic etch. For example, the change in the composition of the ions in the fluorohydrocarbon-containing plasma that accompanies physical exposure of the top surface of the substrate 10 or the optional underlying metal interconnect level structure 200 can be detected by optical means, and employed as a signal that triggers an immediate termination, or a delayed termination (after an overetch), of the anisotropic etch.

The cavity 31 may be a line trench that defines the spatial extent of a conductive line structure to be subsequently formed, or may be a via hole that defines the spatial extent of a conductive via structure to be subsequently formed. A plurality of cavities 31 can be formed in the stack of the nitrogen-containing dielectric layer 28, the interconnect level dielectric layer 30, the dielectric cap layer 32, and the metallic hard mask layer 36.

Figure 6:
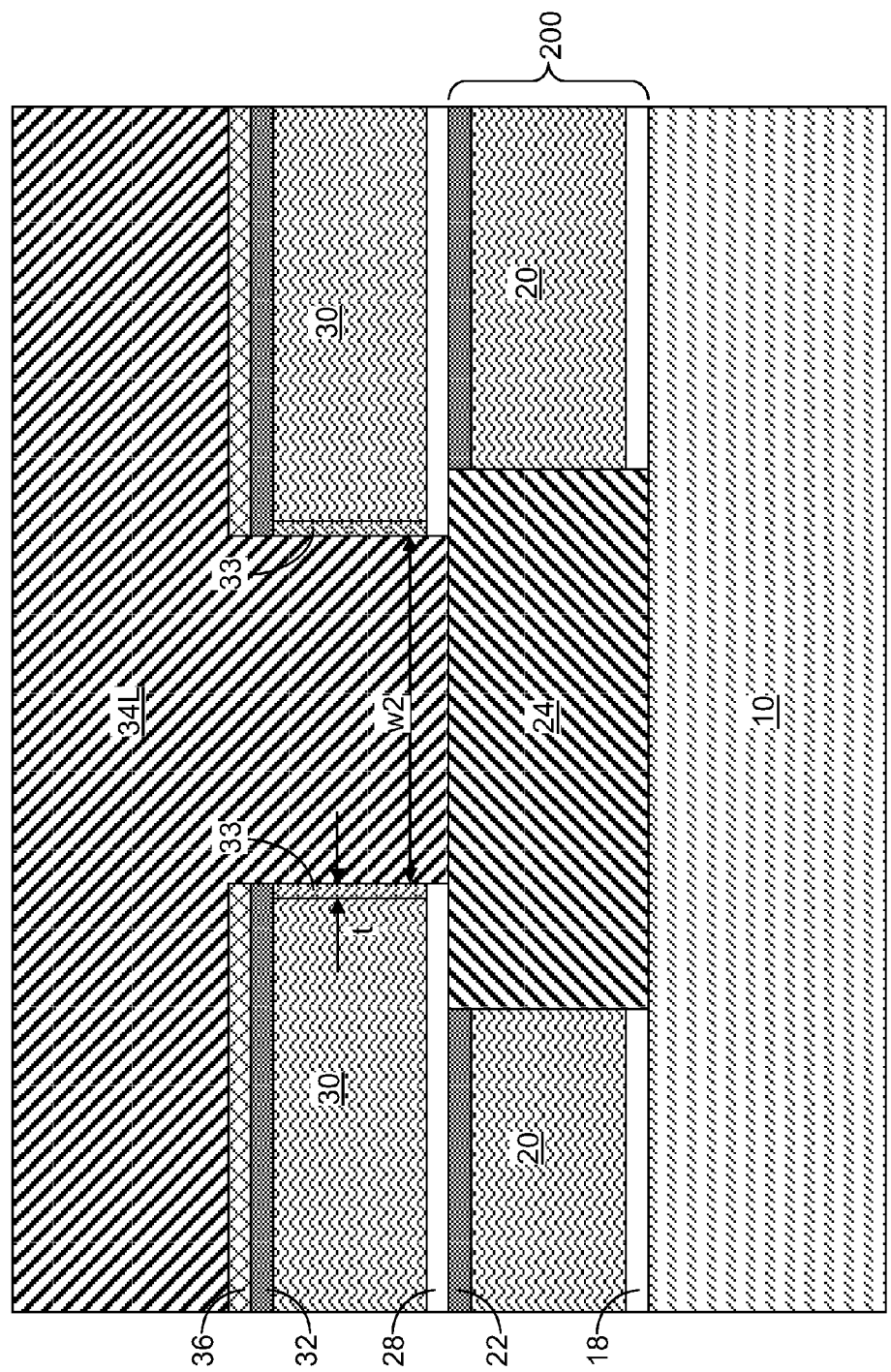
FIG. 6 is a vertical cross-sectional view of the first exemplary structure after removal of a polymer and deposition of a conductive material layer in a cavity within the stack of the nitrogen-containing dielectric layer, the interconnect level dielectric layer, the dielectric cap layer, and the metallic hard mask layer according to the first embodiment of the present disclosure.

Referring to FIG. 6, any remaining polymer at the end of the anisotropic etch is removed, for example, by a wet clean. A conductive material layer 34L is deposited in the cavity 31 within the stack of the nitrogen-containing dielectric layer 28, the interconnect level dielectric layer 30, the dielectric cap layer 32, and the metallic hard mask layer 36, for example, by electroplating, electroless plating, physical vapor deposition (PVD), chemical vapor deposition (CVD), or a combination thereof. The conductive material layer 34L includes at least one metallic material such as Cu, Al, W, TiN, TaN, WN, TiC, TaC, WC, and combinations thereof. The deposited conductive material of the conductive material layer 34L completely fills the cavity 31 within the nitrogen-containing dielectric layer 28, the interconnect level dielectric layer 30, the dielectric cap layer 32, and the metallic hard mask layer 36.

Figure 7:
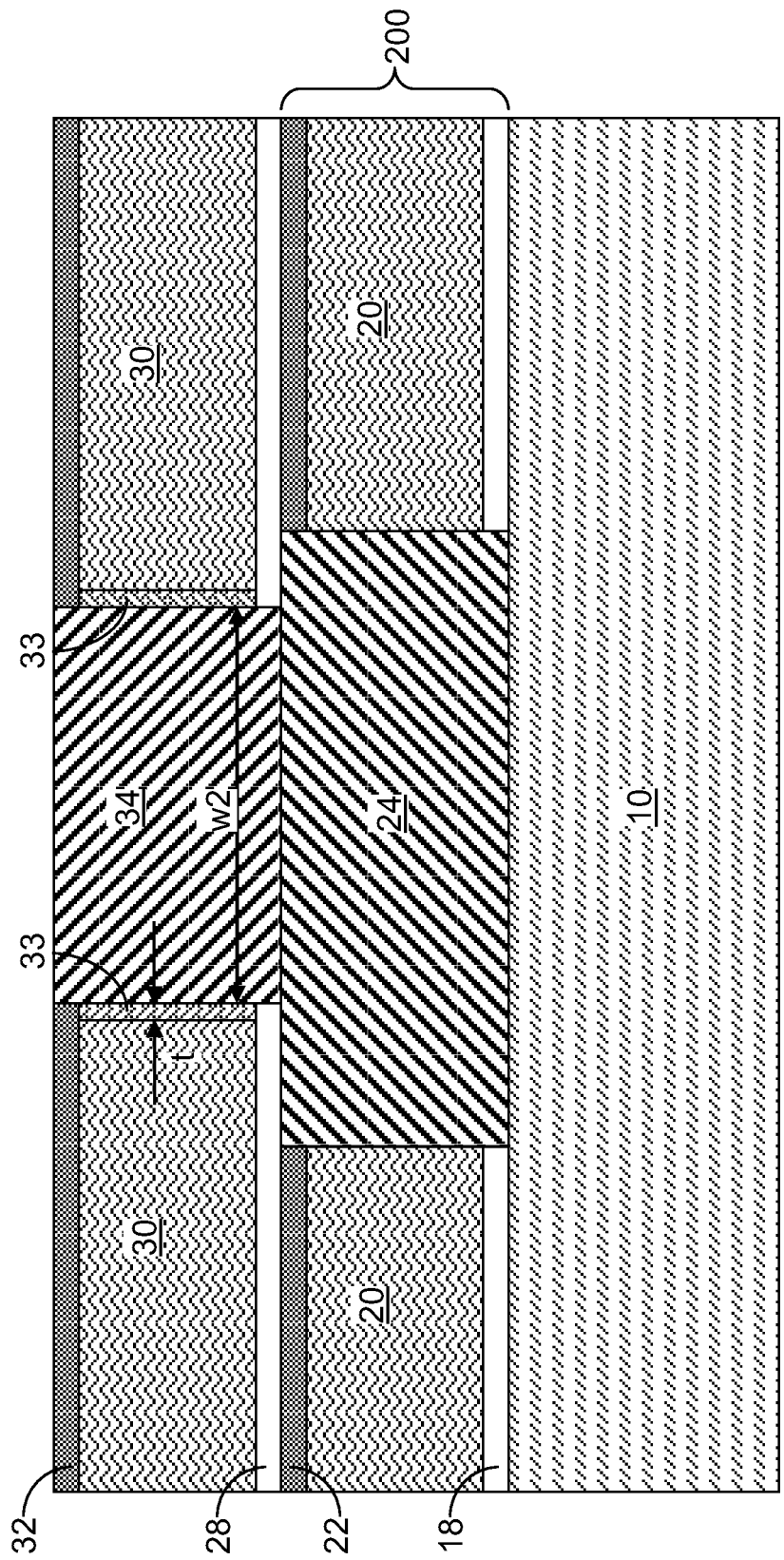
FIG. 7 is a vertical cross-sectional view of the first exemplary structure after planarization of the deposited conductive material and removal of the metallic hard mask layer according to the first embodiment of the present disclosure.

Referring to FIG. 7, the excess conductive material above the top surface of the dielectric cap layer 32 and the metallic hard mask layer 36 are removed, for example, by chemical mechanical planarization (CMP). The dielectric cap layer 32 can be employed as a stopping layer for the planarization process. The remaining portion of the conductive material layer 34L after planarization constitutes a metal interconnect structure 34, which can be a conductive line or a conductive via depending the lateral extent of the conductive material layer 34L and the topological features of the conductive material layer 34L with respect to the underlying at least one conductive structure 24 in the optional underlying metal interconnect level structure 200, if present, and with respect to overlying conductive structures that may be optionally formed.

Figure 8:
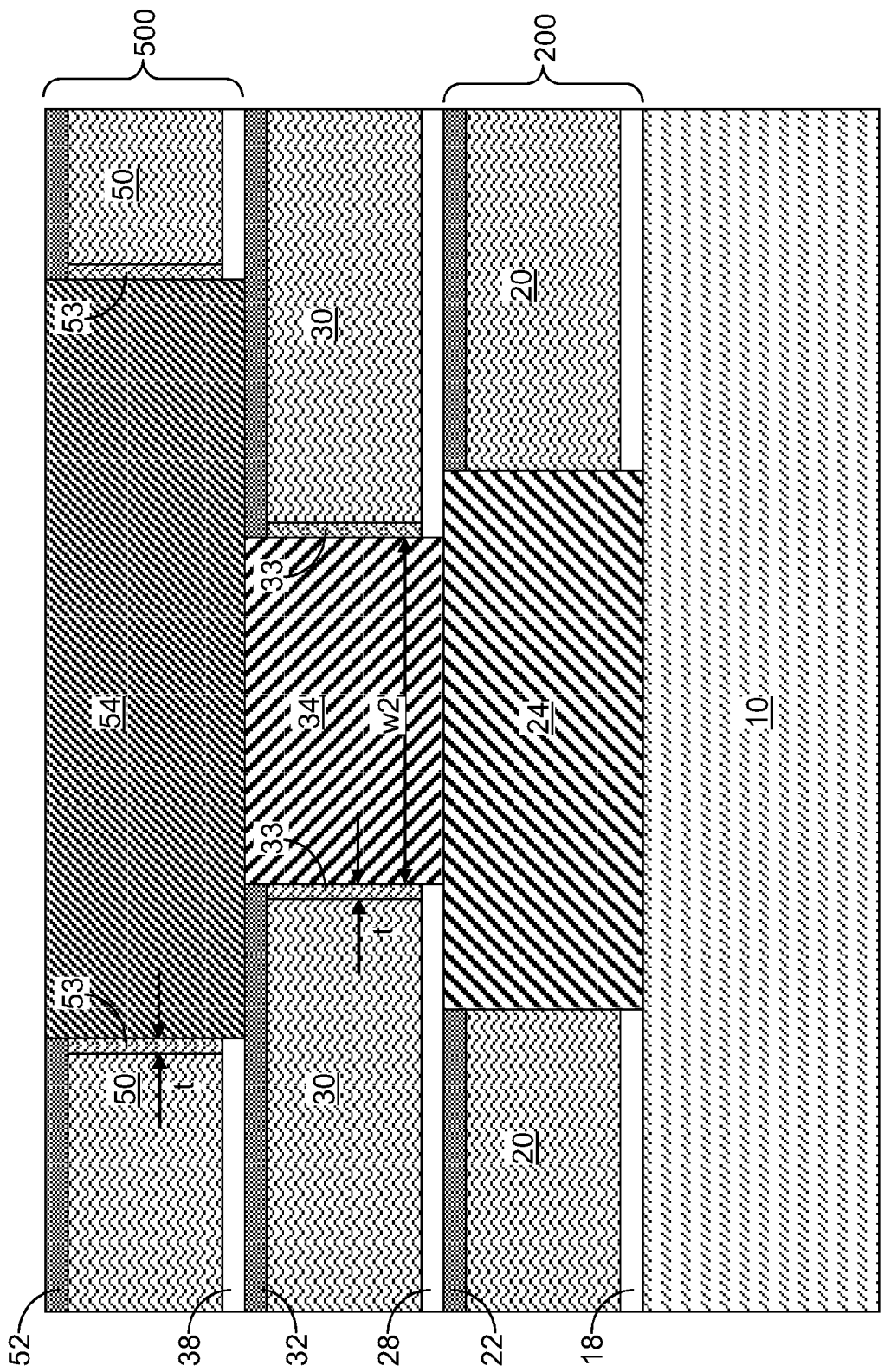
FIG. 8 is a vertical cross-sectional view of the first exemplary structure after forming an overlying interconnect level structure according to the first embodiment of the present disclosure.

Referring to FIG. 8, an overlying interconnect level structure 500 can be optionally formed. The overlying interconnect level structure 500 can include, for example, an overlying nitrogen-containing dielectric layer 38, an overlying interconnect level dielectric layer 50, an overlying dielectric layer 52, and an overlying metal interconnect structure 54. The overlying interconnect level structure 500 can be formed, for example, employing the same methods as in the processing steps of FIGS. 2-7.

Figure 9:
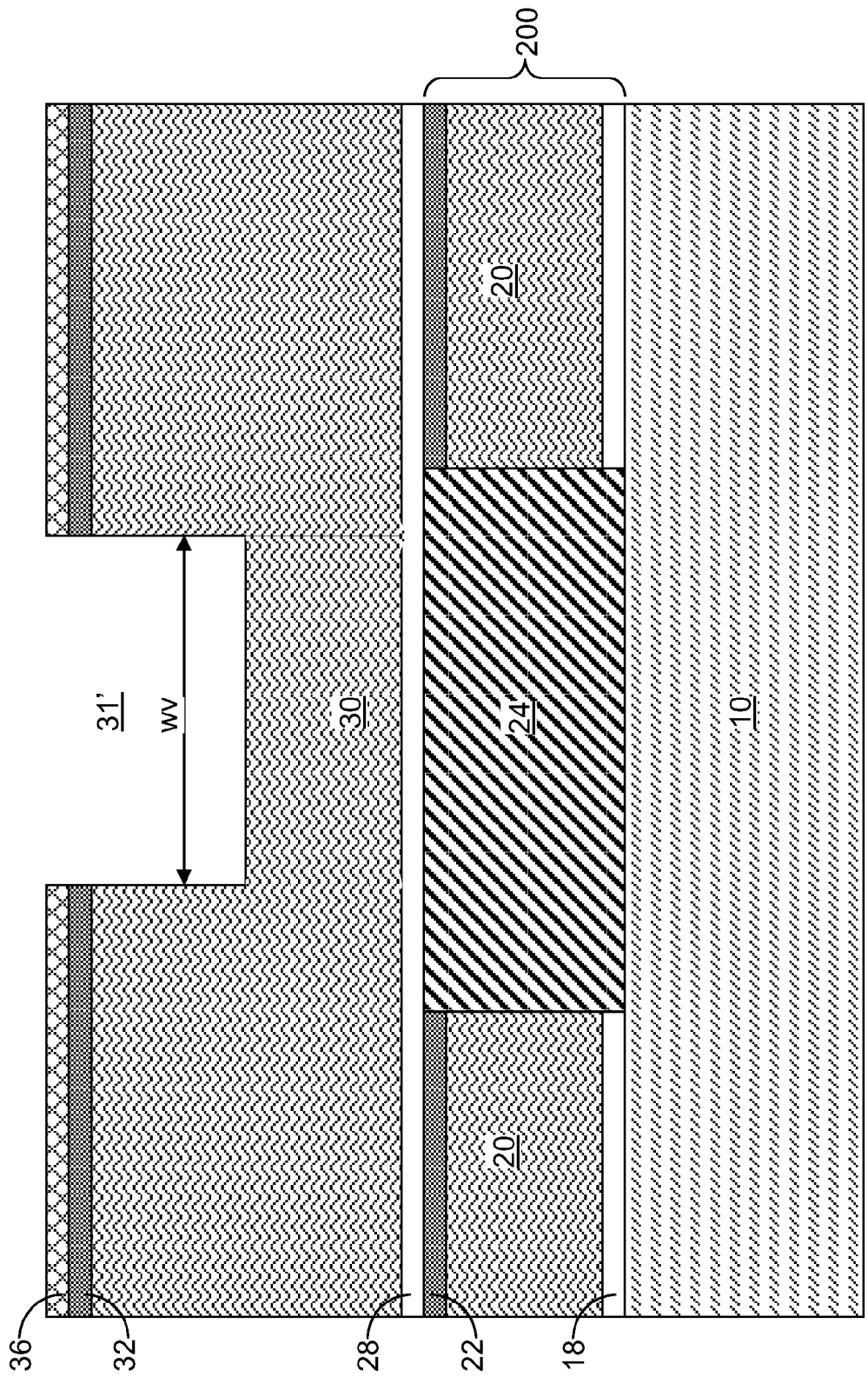
FIG. 9 is a vertical cross-sectional view of a second exemplary structure after formation of a via cavity according to a second embodiment of the present disclosure.

Referring to FIG. 9, a second exemplary structure according to a second embodiment of the present disclosure can be derived from the first exemplary structure of FIG. 1, and by modifying the processing steps of FIG. 2 such that the cavity 31 does not extend to the top surface of the nitrogen-including dielectric layer 28 at the end of the pattern transfer from the photoresist 37 to the upper portion of the interconnect level dielectric layer 30. The cavity 31 as formed within the second exemplary structure is herein referred to as a via cavity 31'. Thus, there is a finite distance between the bottom surface of the via cavity 31' and the top surface of the nitrogen-containing dielectric layer 28 after removal of the photoresist 37 at the processing step corresponding to the processing step of FIG. 3. The vertical distance between the topmost surface of the interconnect level dielectric layer 30 and the bottom surface of the via cavity 31' can be from 15% to 85% of the vertical distance between the topmost surface of the interconnect level dielectric layer 30 and the bottommost surface of the interconnect level dielectric layer 30. The width of the via cavity 31' at the end of the etch is herein referred to as a via width wv. The pattern of the via cavity 31' can be selected to define an area of a conductive via structure to be subsequently formed.

Figure 10:
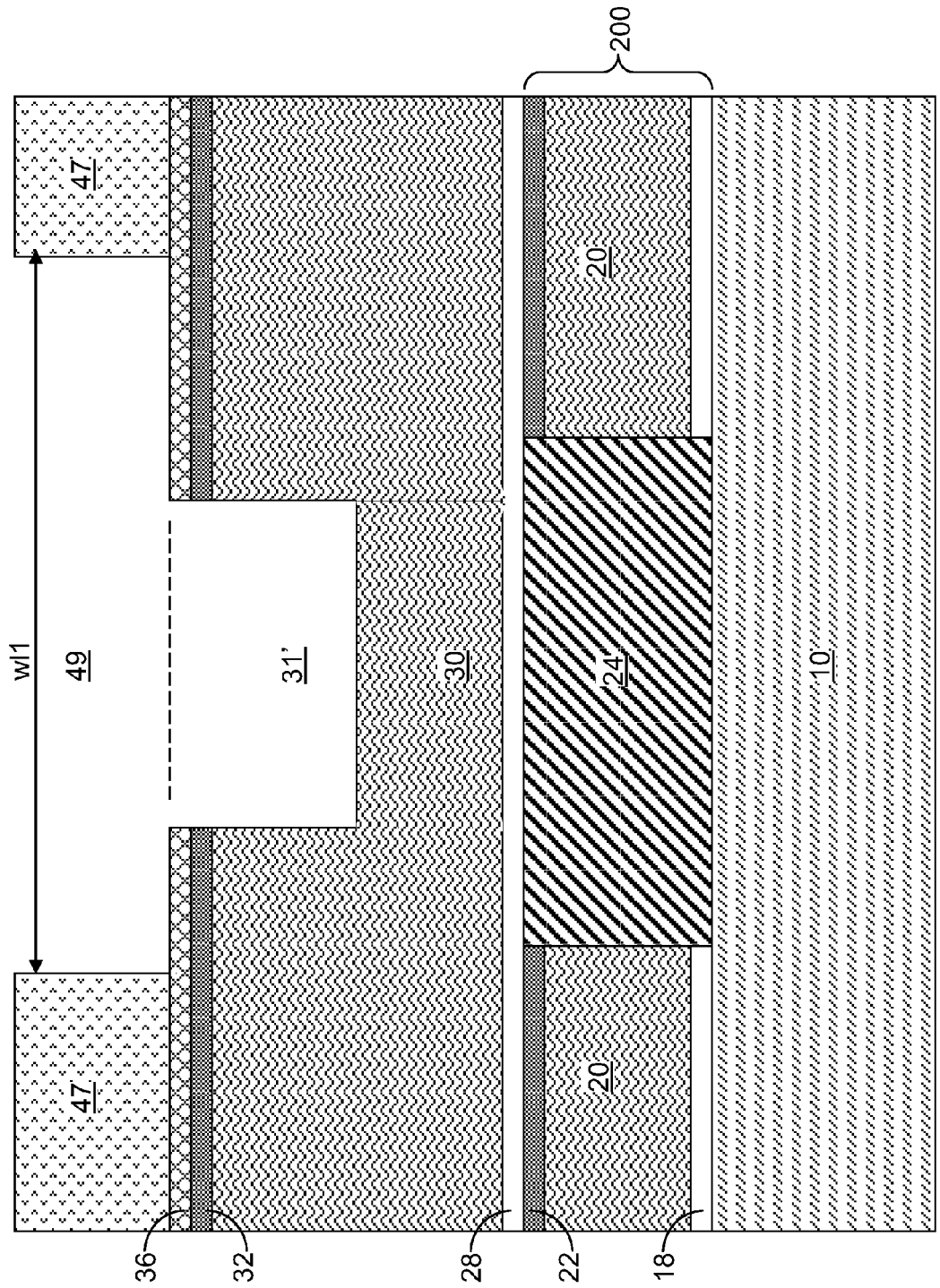
FIG. 10 is a vertical cross-sectional view of the second exemplary structure after applying and lithographically patterning a photoresist according to the second embodiment of the present disclosure.

Referring to FIG. 10, another photoresist 47 is applied over the second exemplary structure, and is lithographically patterned to form an opening 49 in the photoresist 47. The opening 49 overlies the cavity 31, and the area of the opening 49 may include the entirety of the area of the cavity 31. The width of the opening 49 is herein referred to as a line width w1. The pattern of the opening 49 can be selected to define an area of a conductive line structure to be subsequently formed.

Figure 11:
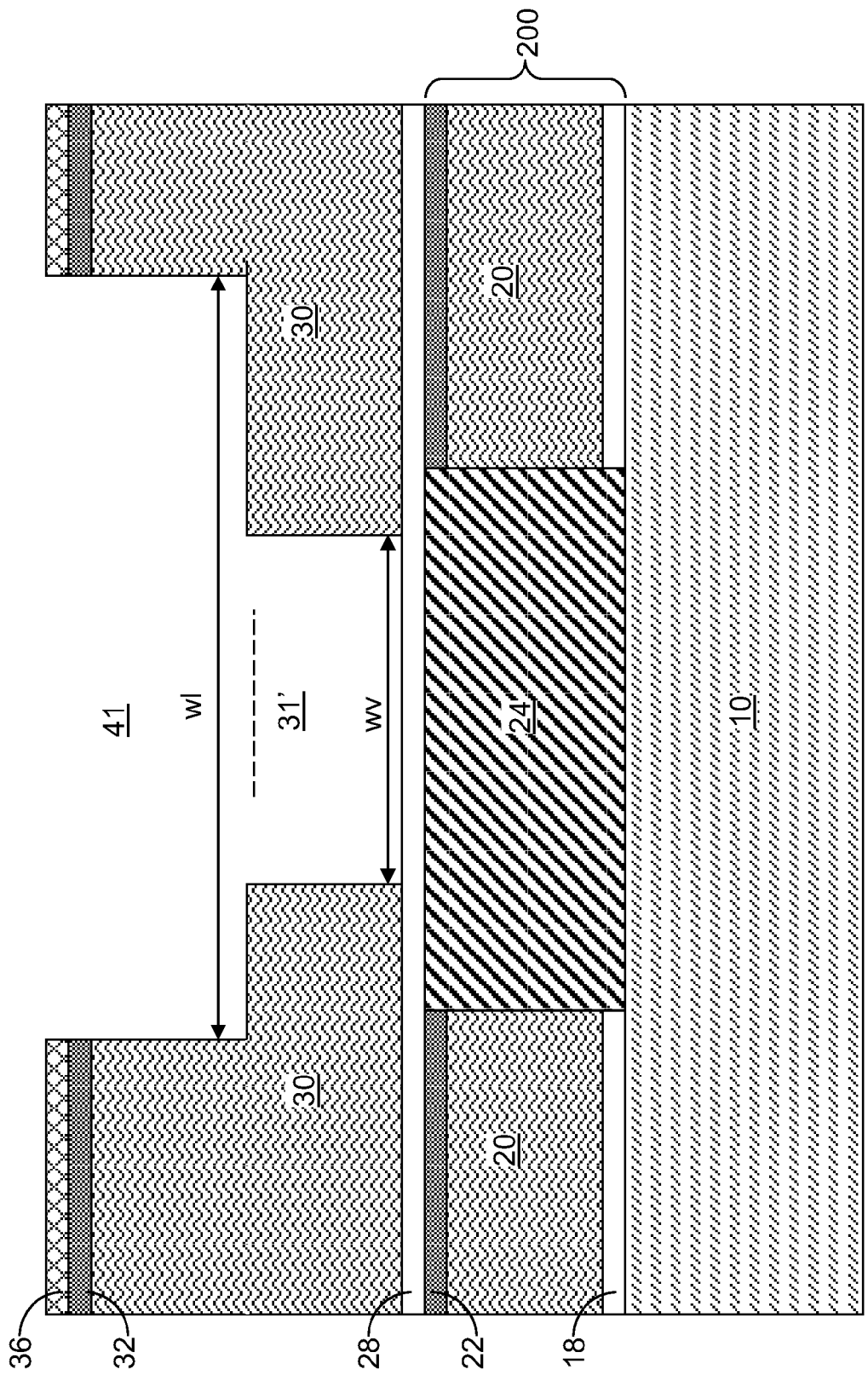
FIG. 11 is a vertical cross-sectional view of the second exemplary structure after transfer of the pattern in the photoresist into a metallic hard mask layer, a dielectric cap layer, and an upper portion of the interconnect level dielectric layer to form a line cavity according to the second embodiment of the present disclosure.

Referring to FIG. 11, an anisotropic etch is performed to transfer the pattern in the metallic hard mask layer 36 into an upper portion of the interconnect level dielectric layer 30 to form a line cavity 41. At the same time, the anisotropic etch also recesses the bottom surface of the via cavity 31'. A dual damascene integrated cavity including the line cavity 41 and the via cavity 31' is formed within the material stack of the interconnect level dielectric layer 30, the dielectric cap layer 32, and the metallic hard mask layer 36. A planar bottom surface of the line cavity 41 can be located at a level between the bottommost surface of the interconnect level dielectric layer 30 and the topmost surface of the interconnect level dielectric layer 30.

The anisotropic etch can employ a plasma of etchants as in the first embodiment. The species for the etchants can be selected based on the composition of the dielectric material in the interconnect level dielectric layer 30 and the selectivity of the anisotropic etch to the metallic material of the metallic hard mask layer 36. In one embodiment, a selectivity greater than 10 can be achieved if the interconnect level dielectric layer 30 includes an organosilicate glass, and the metallic hard mask layer 36 includes a metallic nitride such as TaN, TiN, and/or WN and/or a metallic carbide such as TaC, TiC, and/or WC.

Figure 12:
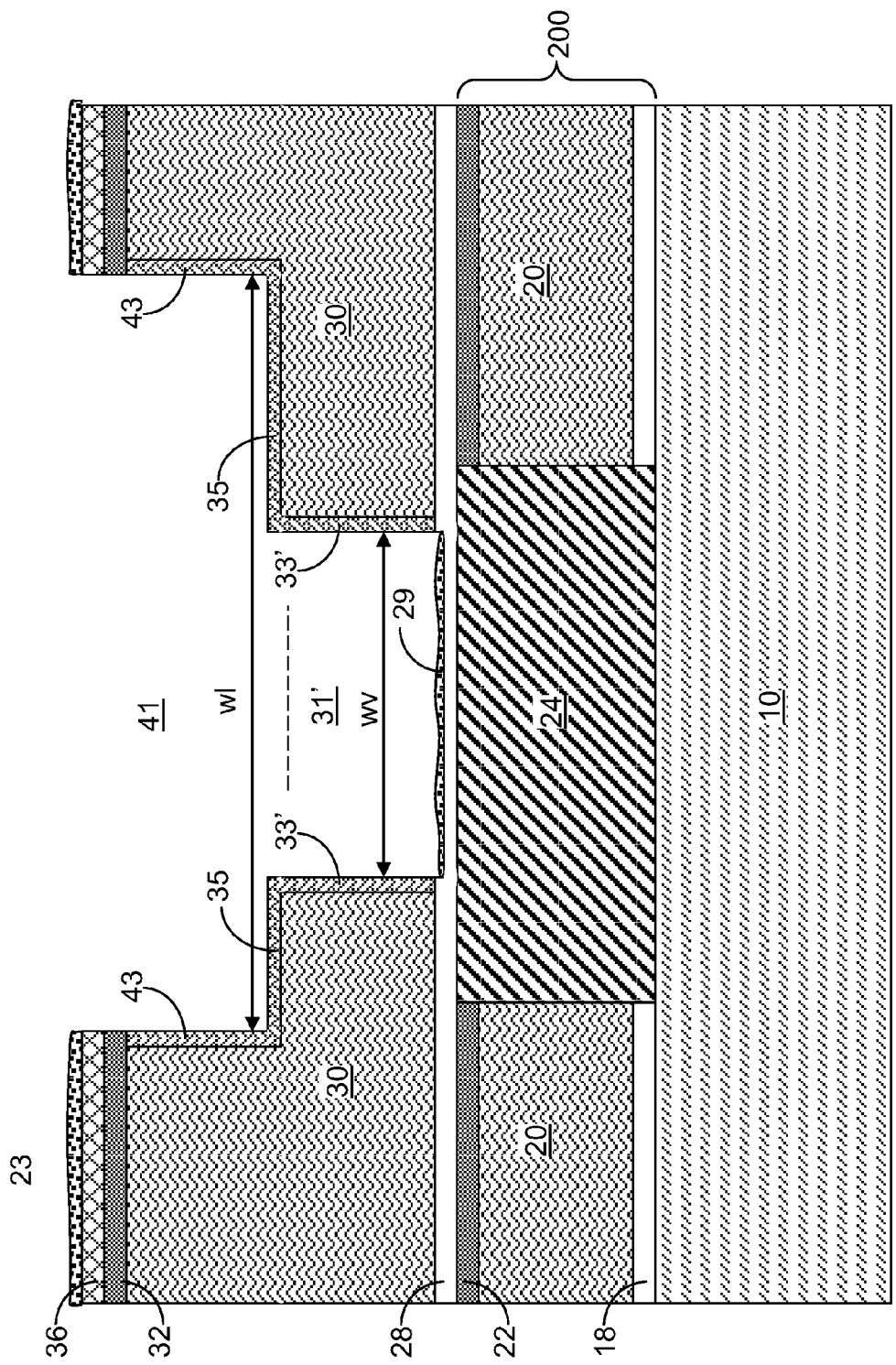
FIG. 12 is a vertical cross-sectional view of the second exemplary structure during an anisotropic etch of the nitrogen-containing dielectric layer according to the second embodiment of the present disclosure.

Referring to FIG. 12, the second exemplary structure is placed into a process chamber configured for a plasma etch. An anisotropic etch employing a fluorohydrocarbon-containing plasma is performed on the second exemplary structure. The pattern in the via cavity 31' is transferred into an upper portion of the nitrogen-containing dielectric layer 28 during the initial phase of the anisotropic etch.

The same fluorohydrocarbon-containing plasma can be employed as in the first embodiment. Thus, a first fluorohydrocarbon-containing polymer portion 29 is formed on a recessed surface of the nitrogen-containing dielectric layer 28, and a second fluorohydrocarbon-containing polymer portion 23 is formed on the top surface of the metallic hard mask layer 36. The composition and physical properties of the first fluorohydrocarbon-containing polymer portion 29 and second fluorohydrocarbon-containing polymer portion 23 are the same as in the first embodiment. Thus, the same nitrogen-containing volatile compound is formed in the second fluorohydrocarbon-containing polymer portion 23 by the reaction of the nitrogen atoms from the nitrogen-containing dielectric layer 28 and the carbon-rich fluorohydrocarbon-containing polymer present within the first fluorohydrocarbon-containing polymer portion 29.

In one embodiment, the interconnect level dielectric layer 30 includes a low-k dielectric material such as organosilicate glass, and the fluorohydrocarbon-containing plasma causes a structural damage to the physically exposed surfaces of the low-k dielectric material. Thus, fluorine can be incorporated into the low-k dielectric material of the interconnect level dielectric layer 30 during the anisotropic etch to convert a vertical surface portion of the interconnect level dielectric layer 30 around the line cavity 41 to form an upper vertical fluorine-containing damaged low-k material portion 43, a horizontal surface portion of the interconnect level dielectric layer 30 at the bottom of the line cavity 41 to form a horizontal fluorine-containing damaged low-k material portion 35, and a vertical surface portion of the interconnect level dielectric layer 30 around the via cavity 31' to form a lower vertical fluorine-containing damaged low-k material portion 33', respectively. The thickness t of the various fluorine-containing damaged low-k material portions (43, 35, 33') can be from 2 nm to 20 nm, although lesser and greater thicknesses can also be employed. Because of the carbon rich nature of the CHF ion and the lower energy, the thickness of the horizontal fluorine-containing damaged low-k material portion 35 is lesser than a thickness of damaged low-k material regions formed in an anisotropic etch process employing a comparable $CF_4$ and/or $CHF_3$ plasmas.

Figure 13:
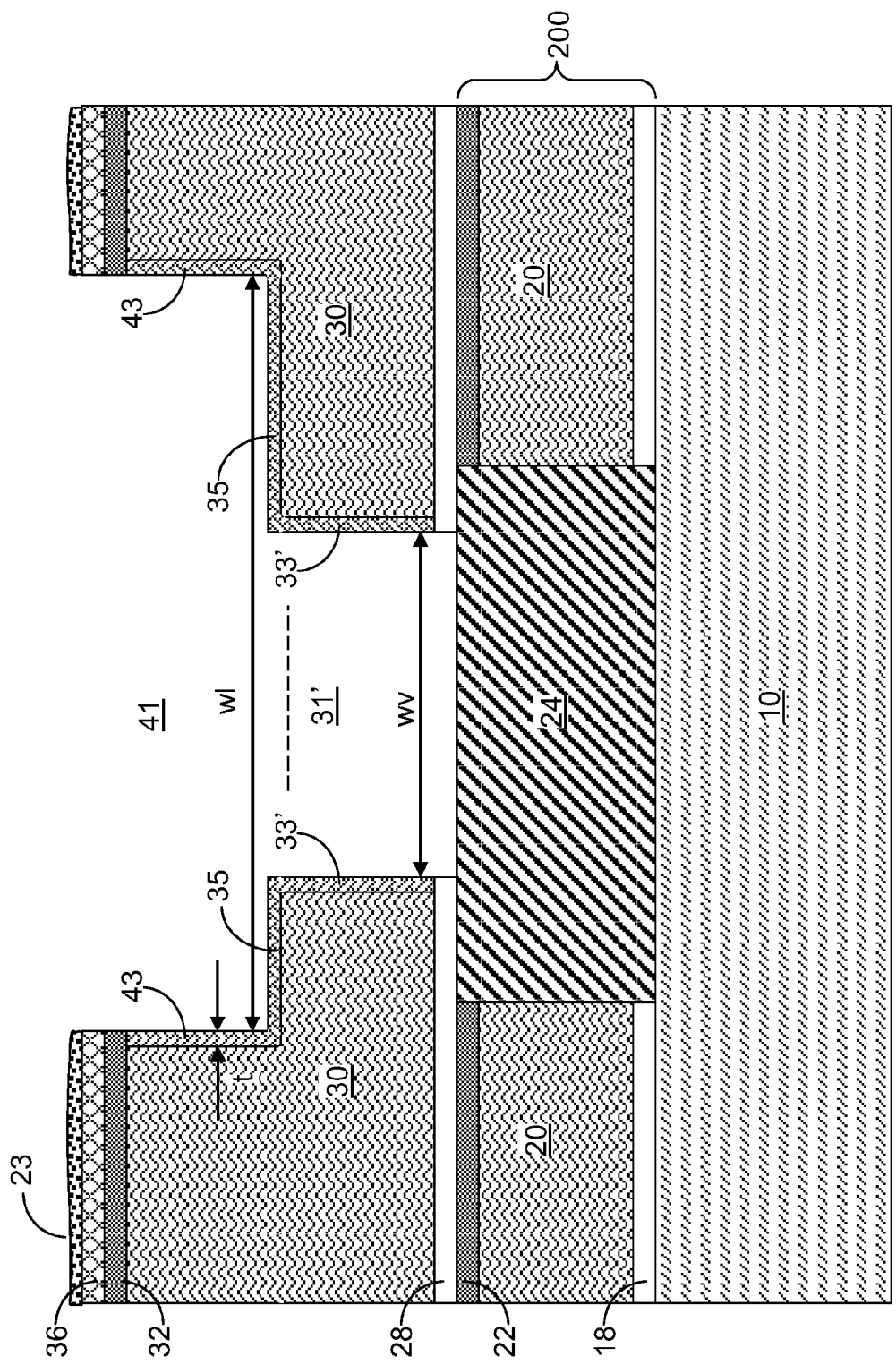
FIG. 13 is a vertical cross-sectional view of the second exemplary structure after the anisotropic etch of the nitrogen-containing dielectric layer according to the second embodiment of the present disclosure.

Referring to FIG. 13, the transfer of the pattern in the via cavity 31' into the nitrogen-containing dielectric layer 28 proceeds to the bottom surface of the nitrogen-containing dielectric layer 28 as the anisotropic etch continues until a top surface of the substrate 10 or a top surface of the optional underlying metal interconnect level structure 200 is exposed. The substrate 10 or the optional underlying metal interconnect level structure 200 can be employed as an etch stop layer for the anisotropic etch. For example, the change in the composition of the ions in the fluorohydrocarbon-containing plasma that accompanies physical exposure of the top surface of the substrate 10 or the optional underlying metal interconnect level structure 200 can be detected by optical means, and employed as a signal that triggers an immediate termination, or a delayed termination (after an overetch), of the anisotropic etch. A plurality of dual damascene integrated cavities (41, 31') can be formed in the stack of the nitrogen-containing dielectric layer 28, the interconnect level dielectric layer 30, the dielectric cap layer 32, and the metallic hard mask layer 36.

Figure 14:
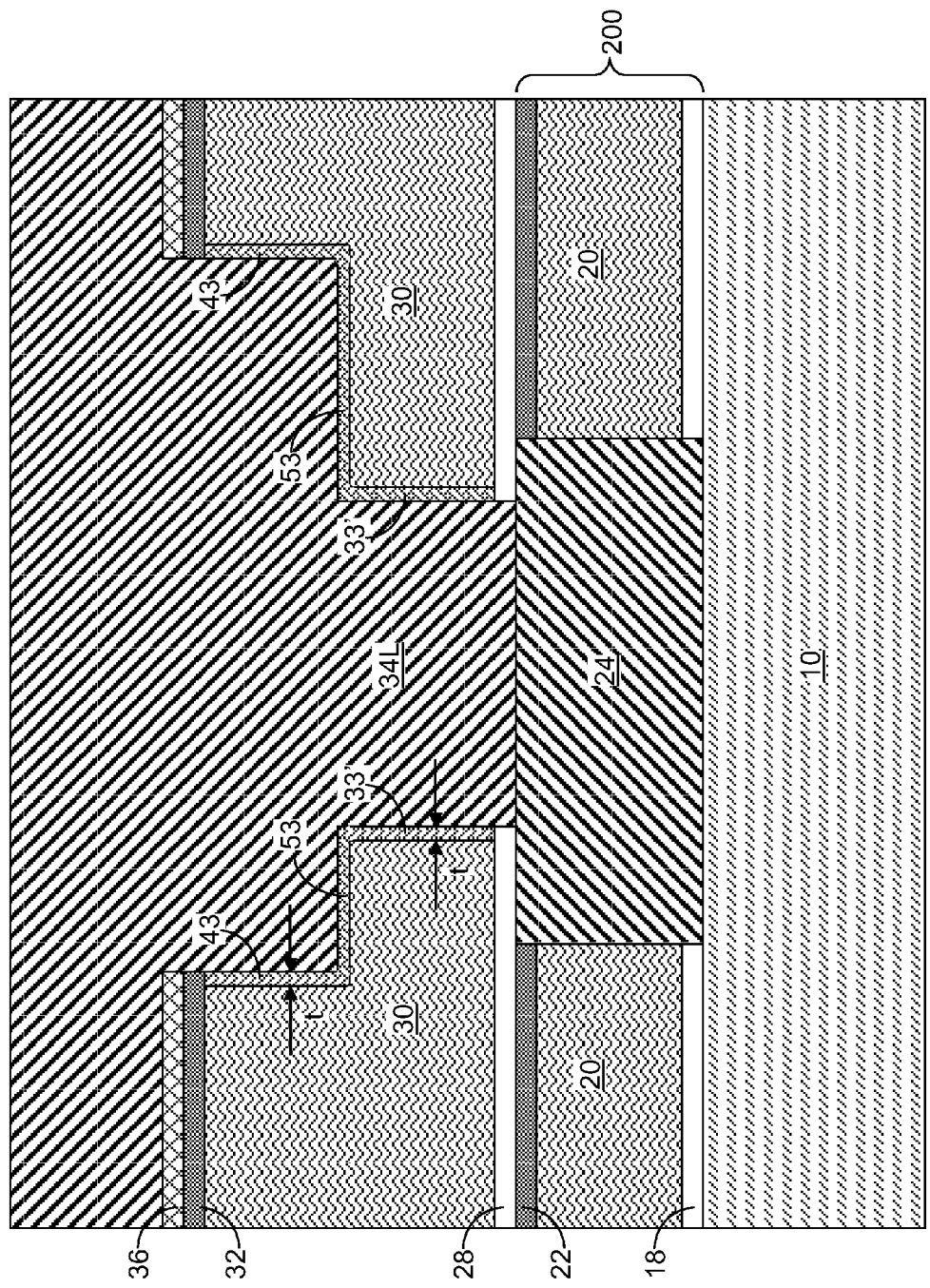
FIG. 14 is a vertical cross-sectional view of the second exemplary structure after removal of a polymer and deposition of a conductive material in a line and via cavity within the stack of the nitrogen-containing dielectric layer, the interconnect level dielectric layer, the dielectric cap layer, and the metallic hard mask layer according to the second embodiment of the present disclosure.

Referring to FIG. 14, any remaining polymer at the end of the anisotropic etch is removed, for example, by a wet clean. A conductive material layer 34L is deposited in the cavity 31 within the stack of the nitrogen-containing dielectric layer 28, the interconnect level dielectric layer 30, the dielectric cap layer 32, and the metallic hard mask layer 36, for example, by electroplating, electroless plating, physical vapor deposition (PVD), chemical vapor deposition (CVD), or a combination thereof. The conductive material layer 34L includes at least one metallic material such as Cu, Al, W, TiN, TaN, WN, TiC, TaC, WC, and combinations thereof. The deposited conductive material of the conductive material layer 34L completely fills the dual damascene integrated cavity (41, 31') within the nitrogen-containing dielectric layer 28, the interconnect level dielectric layer 30, the dielectric cap layer 32, and the metallic hard mask layer 36.

Figure 15:
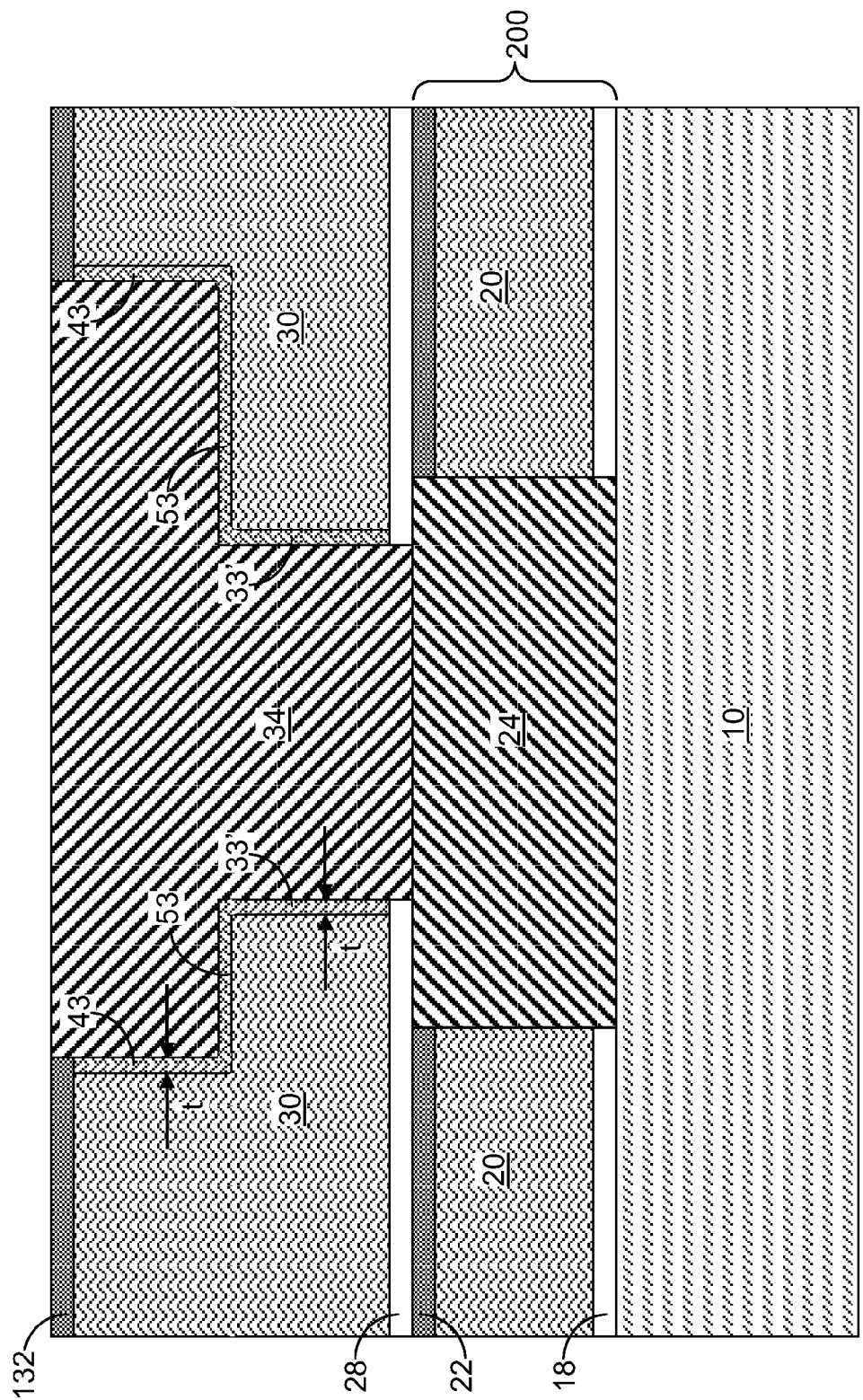
FIG. 15 is a vertical cross-sectional view of the second exemplary structure after planarization of the deposited conductive material and removal of the metallic hard mask layer according to the second embodiment of the present disclosure.

Referring to FIG. 15, the excess conductive material above the top surface of the dielectric cap layer 32 and the metallic hard mask layer 36 are removed, for example, by chemical mechanical planarization (CMP). The dielectric cap layer 32 can be employed as a stopping layer for the planarization process. The remaining portion of the conductive material layer 34L after planarization constitutes a metal interconnect structure 34, which is an integrated line and via structure.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a metal interconnect structure comprising:
    forming a stack comprising, from bottom to top, a substrate, a nitrogen-containing dielectric layer composed of a dielectric metal oxynitride selected from the group consisting of $HfO_xN_y$, $ZrO_xN_y$, $La_2O_xN_y$, $TiO_xN_y$, $SrTiO_xN_y$, $LaAlO_xN_y$, $Y_2O_xN_y$, and an alloy thereof, an interconnect level dielectric material layer, and a hard mask layer;
    forming an opening within said hard mask layer and said interconnect level dielectric material layer; and
    anisotropically etching a physically exposed portion of said nitrogen-containing dielectric layer underneath said opening employing a fluorohydrocarbon-containing plasma, wherein said fluorohydrocarbon-containing plasma includes ions of a hydrofluorocarbon gas having a formula of $C_xH_yF_z$ and selected from alkane hydrofluorocarbon gases and alkene hydrofluorocarbon gases, wherein x is an integer selected from 4, 5, and 6, y and z are positive integers, and y is greater than z, wherein a volatile compound is formed on, and evaporates from, a surface of said nitrogen-containing dielectric layer, wherein said volatile compound comprises nitrogen derived from said nitrogen-containing dielectric layer and a carbon-rich polymer plasma including carbon and fluorine and having a ratio of carbon to fluorine that is greater than 1.

2. The method of claim 1, wherein said fluorohydrocarbon-containing plasma includes ions having an average kinetic energy in a range from 10 eV to 100 eV.

3. The method of claim 1, wherein said carbon-rich polymer is additionally formed on a top surface of said hard mask layer during said anisotropic etching.

4. The method of claim 3, wherein said carbon-rich polymer has a refractive index in a range from 1.8 to 2.2.

5. The method of claim 3, wherein said carbon-rich polymer has a density in a range from 1.5 g/cm$^3$ to 1.7 g/cm$^3$.

6. The method of claim 1, wherein said carbon-rich polymer includes hydrogen at an atomic concentration that is at least one half of said atomic concentration of carbon in said carbon-rich polymer.

7. The method of claim 6, wherein an atomic ratio of hydrogen to carbon in said carbon-rich polymer is between 0.5 and 3.0.

8. The method of claim 1, wherein said carbon-rich polymer has a composition that includes carbon at an atomic concentration between 30% and 40%, hydrogen at an atomic concentration between 40% and 50%, fluorine at an atomic concentration between 5.0% and 10%, and oxygen at an atomic concentration less than 5%.

9. The method of claim 1, wherein said nitrogen-containing dielectric layer comprises silicon nitride.

10. The method of claim 1, wherein said nitrogen-containing dielectric layer comprises a dielectric material having a dielectric constant less than 3.9 and including nitrogen.

11. The method of claim 10, wherein said nitrogen-containing dielectric layer comprises Si, C, O, H, and N.

12. The method of claim 1, wherein said hard mask layer comprises a metallic material.

13. The method of claim 12, further comprising forming another hard mask layer having a dielectric constant of at least 3.9 between said interconnect level dielectric material layer and said hard mask layer.

14. The method of claim 1, wherein physically exposed surfaces of said interconnect level dielectric material layer is structurally damaged by said hydrofluorocarbons-containing plasma, and fluorine is incorporated into said interconnect level dielectric material layer during said anisotropic etching.

15. The method of claim 1, further comprising forming a conductive metal interconnect structure extending through an opening in said nitrogen-containing dielectric layer and through said opening within said hard mask layer and said interconnect level dielectric material layer.

* * * * *